(12) United States Patent
Tsukuda et al.

(10) Patent No.: US 10,110,212 B2
(45) Date of Patent: Oct. 23, 2018

(54) ELECTRONIC CIRCUIT, SOLID STATE IMAGE CAPTURING APPARATUS AND METHOD OF CONTROLLING ELECTRONIC CIRCUIT

(71) Applicant: Sony Corporation, Tokyo (JP)

(72) Inventors: Yasunori Tsukuda, Kanagawa (JP); Sen Yu, San Jose, CA (US); Brian Carey, Sunnyvale, CA (US)

(73) Assignee: Sony Corporation, Tokyo (JP)

( * ) Notice: Subject to any disclaimer, the term of this patent is extended or adjusted under 35 U.S.C. 154(b) by 182 days.

(21) Appl. No.: 15/050,767

(22) Filed: Feb. 23, 2016

(65) Prior Publication Data
US 2017/0244397 A1   Aug. 24, 2017

(51) Int. Cl.
| H04N 3/14 | (2006.01) |
| H04N 5/335 | (2011.01) |
| H03K 5/15 | (2006.01) |
| H03K 5/156 | (2006.01) |
| H04N 5/378 | (2011.01) |

(52) U.S. Cl.
CPC ....... *H03K 5/15066* (2013.01); *H03K 5/1565* (2013.01); *H04N 5/378* (2013.01)

(58) Field of Classification Search
CPC ... H03K 5/15066; H03K 5/1565; H04N 5/378
USPC .................................. 348/222.1, 294–324
See application file for complete search history.

(56) References Cited

U.S. PATENT DOCUMENTS

2007/0018074 A1\* 1/2007 Kinoshita .............. H04N 9/045
250/208.1

FOREIGN PATENT DOCUMENTS

JP      2011-171889 A      1/2011

\* cited by examiner

*Primary Examiner* — Yogesh Aggarwal
(74) *Attorney, Agent, or Firm* — Michael Best & Friedrich LLP

(57) ABSTRACT

There is provided an electronic circuit including a timing signal generation unit for generating a timing signal; a data signal supply unit for synchronizing with the timing signal generated to supply a data signal; a data signal transmission circuit for transmitting the data signal supplied; a timing signal transmission circuit for transmitting the timing signal generated by a circuit having a substantially same delay time as the data signal transmission circuit; and a data holding unit for synchronizing with the timing signal transmitted to hold and output the data signal transmitted. Also, there are provided a solid state image capturing apparatus and a method of controlling the electronic circuit.

18 Claims, 27 Drawing Sheets

| S (CLK$_{OP900\_D}$) | R (CLK$_{OP098\_D}$) | Q (Output terminal of latch circuit) |
|---|---|---|
| 0 | 0 | Hold status |
| 0 | 1 | 0 |
| 1 | 0 | 1 |

FIG.21

| D | CK (CLK$_{0P000\_D}$) | EN (CLK$_{0P090\_D}$ inverted) | Q (Output terminal of flip flop) |
|---|---|---|---|
| 1 | --- | 0 | 0 |
| 1 | ↑ | 1 | 1 |
| 1 | ↓ | 1 | Hold status |

FIG.24

ELECTRONIC CIRCUIT, SOLID STATE IMAGE CAPTURING APPARATUS AND METHOD OF CONTROLLING ELECTRONIC CIRCUIT

BACKGROUND

The present disclosure relates to an electronic circuit, a solid state image capturing apparatus, and a method of controlling the electronic circuit. More particularly, the present disclosure relates to an electronic circuit that synchronizes with a timing signal and outputs a data signal, a solid state image capturing apparatus, and a method of controlling the electronic circuit.

In the related art, an image sensor is used for capturing an image in an image capturing apparatus. For example, an image sensor including pixels, latches, drivers, amplifiers, flip flops and an output data processing unit (for example, see Japanese Patent Application Laid-Open No. 2011-171889). In the image sensor, the latches are disposed in an array, and the driver, sense amplifiers and the flip flops are disposed for each row of the latches. The latch holds pixel data, the driver is synchronized with a clock signal from the data processing unit, reads the pixel data from the latch, and outputs to a sense amplifier. The sense amplifier amplifies the pixel data to provide the flip flop with the pixel data. The flip flop is synchronized with the clock signal generated by the output data processing unit, holds and outputs the pixel data. The pixel data generates images.

Unfortunately, in the above-described image sensor, there may be generated a difference between a delay time until the pixel data is transmitted from the latch to the flip flop and a delay time until the clock signal is transmitted from the output data processing unit to the flip flop. This is because circuit configurations of transmission paths of the pixel data and the clock signal (in other words, the timing signal) are different. The difference between the delay times caused by the difference in the circuit configurations (i.e., a skew) is increased or decreased depending on the conditions of a process, a voltage and a temperature. By the skew, it may be undesirably difficult to increase a reading speed of the data signal of the pixel data.

SUMMARY

In view of the circumstances as described above, there is a need for decreasing the delay times between the data signal and the timing signal in the circuit for transmitting the data signal synchronized with the timing signal.

According to a first embodiment of the present disclosure, there is provided an electronic circuit, including a timing signal generation unit for generating a timing signal; a data signal supply unit for synchronizing with the timing signal generated to supply a data signal; a data signal transmission circuit for transmitting the data signal supplied; a timing signal transmission circuit for transmitting the timing signal generated by a circuit having a substantially same delay time as the data signal transmission circuit; and a data holding unit for synchronizing with the timing signal transmitted to hold and output the data signal transmitted. This provides an effect that the timing signal is transmitted by the circuit having a substantially same delay time as the data signal transmission circuit.

In the first embodiment, the data signal transmission circuit may include a data signal attenuation driver for attenuating and outputting an amplitude of the data signal supplied, and a data signal amplifying unit for amplifying the amplitude of the data signal outputted from the data signal attenuation driver to supply to the data holding unit; and the timing signal transmission circuit may include a timing signal attenuation driver for attenuating and outputting the amplitude of the timing signal, and a timing signal amplifying unit for amplifying the amplitude of the timing signal outputted from the timing signal attenuation driver to supply to the data holding unit. This provides an effect that the amplitudes of the data signal and timing signal are attenuated for transmission.

In the first embodiment, the data signal transmission circuit and the timing signal transmission circuit may be arranged adjacent along a predetermined direction. This provides an effect that the timing signal transmission circuit disposed adjacent to the data signal transmission circuit transmits the timing signal.

In the first embodiment, the electronic circuit further includes a multiphase unit for multiphasing the timing signal generated into a plurality of timing signals having different phases each other to supply to the timing signal transmission unit; and a restore unit for restoring a signal having the same duty ratio as the timing signal generated from a plurality of the timing signals transmitted, and in which the timing signal transmission circuit may transmit in parallel each of a plurality of the timing signals by the circuit having a substantially same delay time as the data signal transmission circuit. This provides an effect that the timing signal is multiphased and transmitted.

In the first embodiment, the multiphase unit may frequency-divide the frequency of the timing signal generated and multiphase a plurality of the timing signals, and the restore unit may restore the signal having the same frequency and duty ratio as the timing signal generated. This provides an effect that timing signal is frequency-divided and multiphased.

In the first embodiment, a plurality of the timing signals may include two frequency signals having different phases each other. This provides an effect that the timing signal is multiphased into two frequency signals.

In the first embodiment, a plurality of the timing signals may include first, second, third and fourth frequency signals having different phases each other. This provides an effect that the timing signal is multiphased into four frequency signals.

In the first embodiment, the restore unit may include an internal signal output unit for outputting a signal having a predetermined value as a first internal signal from the rise of the first frequency signal to a rise of the second frequency signal, and outputting a signal having a predetermined value as a second internal signal from the rise of the third frequency signal to a rise of the fourth frequency signal, and a logic add gate for outputting a logical add signal of the first and second internal signals as the signal restored. This provides an effect that the logic add signal of the first internal signal generated from the first and second frequency signals and the second internal signal generated from the third and fourth frequency signals is outputted.

In the first embodiment, the internal signal output unit may include a first latch circuit for setting a first hold value to a high level when only the first frequency signal of the first and second frequency signals is at a high level, resetting the first hold value to a low level when only the second frequency signal of the first and second frequency signals is at a high level, and outputting the first hold value as the first internal signal, a second latch circuit for setting a second hold value to a high level when only the third frequency signal of the third and fourth frequency signals is at a high level, resetting the second hold value to a low level when only the fourth frequency signal of the third and fourth frequency signals is at a high level, and outputting the second hold value as the second internal signal. This provides an effect that the first and second latch circuit outputs the first and second internal signals.

In the first embodiment, the internal signal output unit may include a first flip flop for synchronizing with the rise of the first frequency signal when the second signal is at a low level, and outputting a high level signal as the first internal signal, a second flip flop for synchronizing with the rise of the fourth frequency signal when the third signal is at a low level, and outputting a high level signal as the second internal signal. This provides an effect that the first and second flip flops output the first and second internal signals.

In the first embodiment, the electronic circuit further includes a control signal output unit for synchronizing a control signal that instructs a supply of the data signal with the clock signal generated and outputting the control signal, and a control signal delay unit for delaying the control signal outputted over a predetermined delay time and supplying the control signal to the data signal supply unit, in which the data holding unit may include a data holding circuit for synchronizing with the timing signal transmitted and holding and outputting the data signal transmitted, and a timing signal delay unit for delaying the timing signal transmitted over a delay time substantially matched with the predetermined delay time and supplying the timing signal to the data holding circuit, and the data signal supply unit may supply the data signal based on the control signal. This provides an effect that the timing signal is delayed over the delay time substantially matched with the predetermined delay time that delays the control signal.

In the first embodiment, the data signal supply unit may include a plurality of data signal production circuits each of which generates the data signal, a plurality of the data signal production circuits may be arranged in a two-dimensional lattice, and the data signal transmission circuit may be arranged for each of the data signal production circuit arranged in a predetermined direction and transmit the data signal along the predetermined direction. This provides an effect that, by the data signal transmission circuit arranged for each of the data signal production circuit arranged in a predetermined direction, the data signal is transmitted long the predetermined direction.

According to a second embodiment of the present disclosure, there is provided a solid state image capturing apparatus, including a timing signal generation unit for generating a timing signal; a data signal supply unit for synchronizing with the timing signal generated to supply a data signal; a data signal transmission circuit for transmitting the data signal supplied; a timing signal transmission circuit for transmitting the timing signal generated by a circuit having a substantially same delay time as the data signal transmission circuit; and a data holding unit for synchronizing with the timing signal transmitted to hold and output the data signal transmitted. This provides an effect that, by the circuit having a substantially same delay time as the data signal transmission circuit, the timing signal is transmitted.

In the second embodiment, the solid state image capturing apparatus further includes a first semiconductor on which a pixel for generating a pixel signal is arranged, in which the data signal supply unit may generate the data signal from the pixel signal, synchronizes with the timing signal, and may supply the data signal transmission circuit with the data signal, the timing signal generation unit, the data signal supply unit, the data signal transmission circuit, and the timing signal transmission circuit may be disposed in a second semiconductor connected to the first semiconductor. This provides an effect that, by the timing signal transmission circuit disposed at the semiconductor different from the data signal transmission circuit, the timing signal is transmitted.

According to the present disclosure, in a circuit that synchronizes with the timing signal and transmits the data signal, it can show excellent effectiveness that a difference between transmission delays of a data signal and a timing signal can be decreased. The effects herein described are not limited, and any of the effects described in the present disclosure may be provided.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 21 is a truth table showing one example of an operation of a latch circuit is a second embodiment;

FIG. 24 is a truth table showing one example of an operation of a flip flop in a first alternative embodiment of a second embodiment;

DETAILED DESCRIPTION OF EMBODIMENTS

Hereinafter, embodiments of the present disclosure will be described with reference to the drawings. The embodiments of the present disclosure will be described in the following order.
<1. First Embodiment> (Example of transmitting data and clock by substantially same circuit)
<2. Second Embodiment> (Example of frequency-dividing clock and transmitting data and clock by substantially same circuit)
1. First Embodiment
[Configuration Example of Image Sensor]

Figure 1:
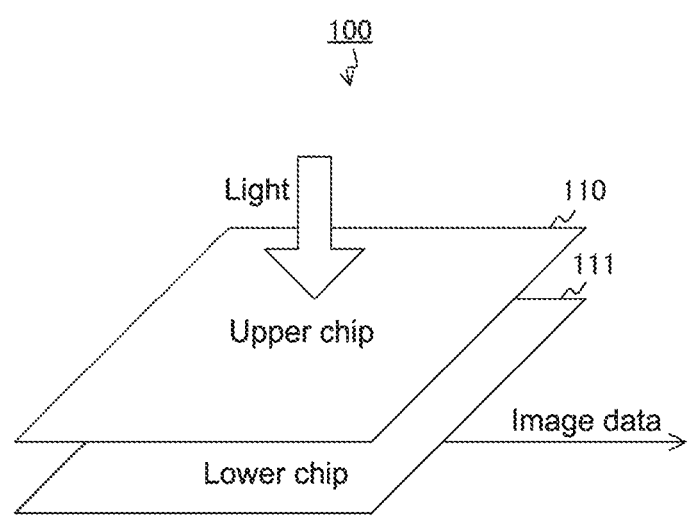
FIG. 1 is a perspective diagram showing one configuration example of an image sensor in a first embodiment.

FIG. 1 is a perspective diagram showing one configuration example of an image sensor 100 in a first embodiment. The image sensor 100 is disposed in a variety of electronic apparatuses such as a digital camera (solid state image capturing apparatus), a digital video camera, a medical detection apparatus and a beauty image diagnosis apparatus. Also, the image sensor 100 includes an upper chip 110 and a lower chip 111 laminated. The upper chip 110 is one example of the first semiconductor as described in claims, and the lower chip 111 is one example of the second semiconductor as described in claims.

The upper chip 110 converts light into an electric signal to provide the lower chip 111 with the electric signal. The lower chip 111 generates and outputs image data from the electric signal generated at the upper chip 110. The image data outputted is processed by an image processing unit in the electronic apparatus.

Figure 2:
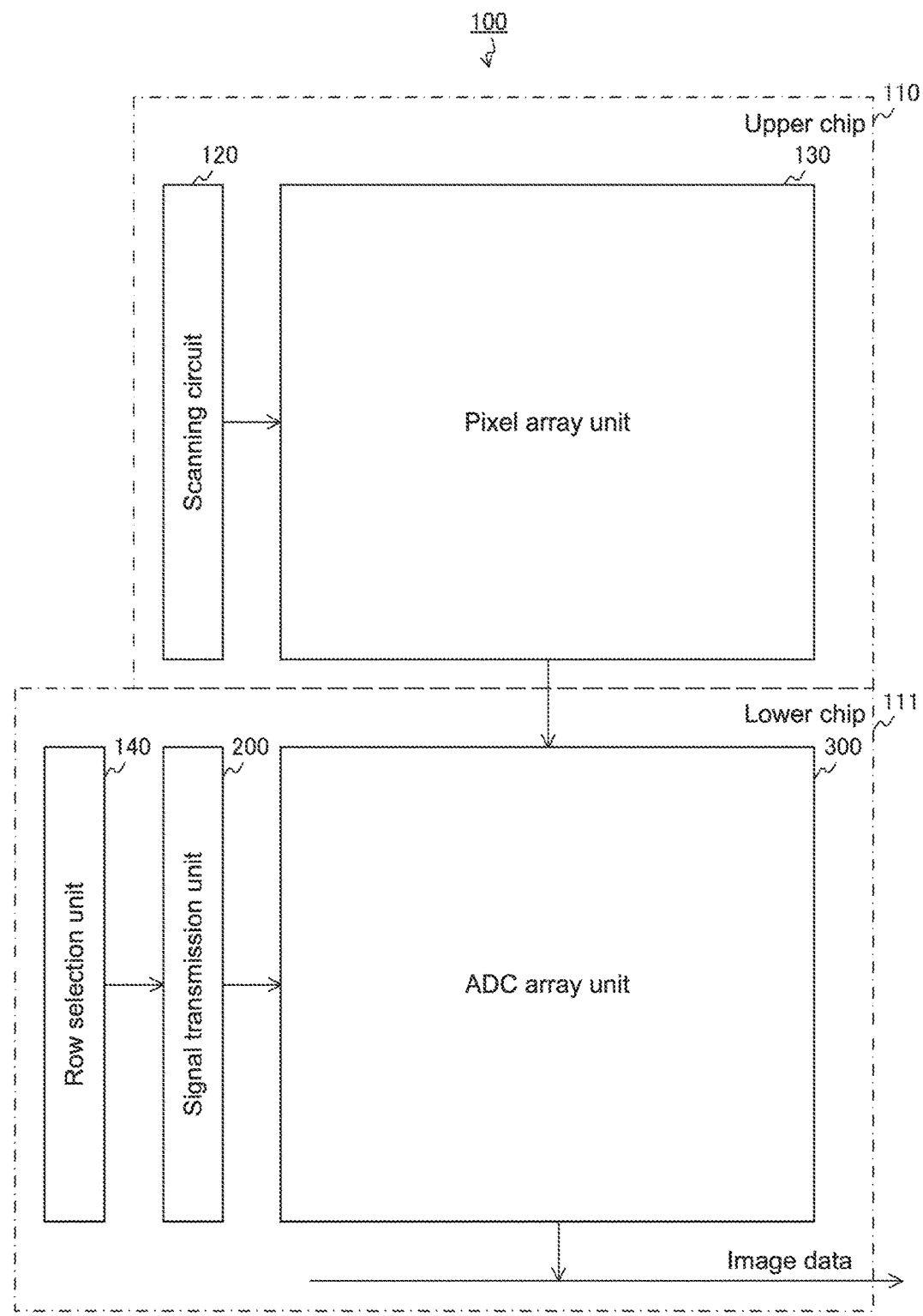
FIG. 2 is a block diagram showing one configuration example of an upper chip and a lower chip in a first embodiment.

FIG. 2 is a block diagram showing one configuration example of the upper chip 110 and the lower chip 111 in the first embodiment. The upper chip 110 includes a scanning circuit 120 and a pixel array unit 130. The lower chip 111 includes a row selection unit 140, a signal transmission unit 200 and an ADC (Analog to Digital Converter) array unit 300. The circuit in the lower chip 111 is one example of an electronic circuits described in claims.

The scanning circuit 120 controls the pixel array unit 130, and outputs a plurality of pixel signals. The pixel array unit 130 includes a plurality of pixels arranged in a two-dimensional lattice. Each pixel converts light into an analog electric signal in accordance with a control of the scanning circuit 120, and outputs an electric signal to the ADC array unit 300 as the pixel signal.

The ADC array unit 300 includes a plurality of AD converting units arranged in a two-dimensional lattice. Each AD converting unit converts a pixel signal into a digital signal to output the pixel data in accordance with a control of the row selection unit 140. In the ADC array unit 300, a line including the AD converting units arranged in a predetermined direction is hereinafter referred to as an "ADC row".

The row selection unit 140 selects the ADC row in the order, and allows the AD converting units of the ADC row selected to be performed an AD conversion. The row selection unit 140 generates, for example, a clock signal and a selection signal. These signals control the ADC array unit 300.

The signal transmission unit 200 transmits the clock signal and the selection signal from the row selection unit 140 to the ADC array unit 300.
[Configuration Example of Pixel Array Unit]

Figure 3:
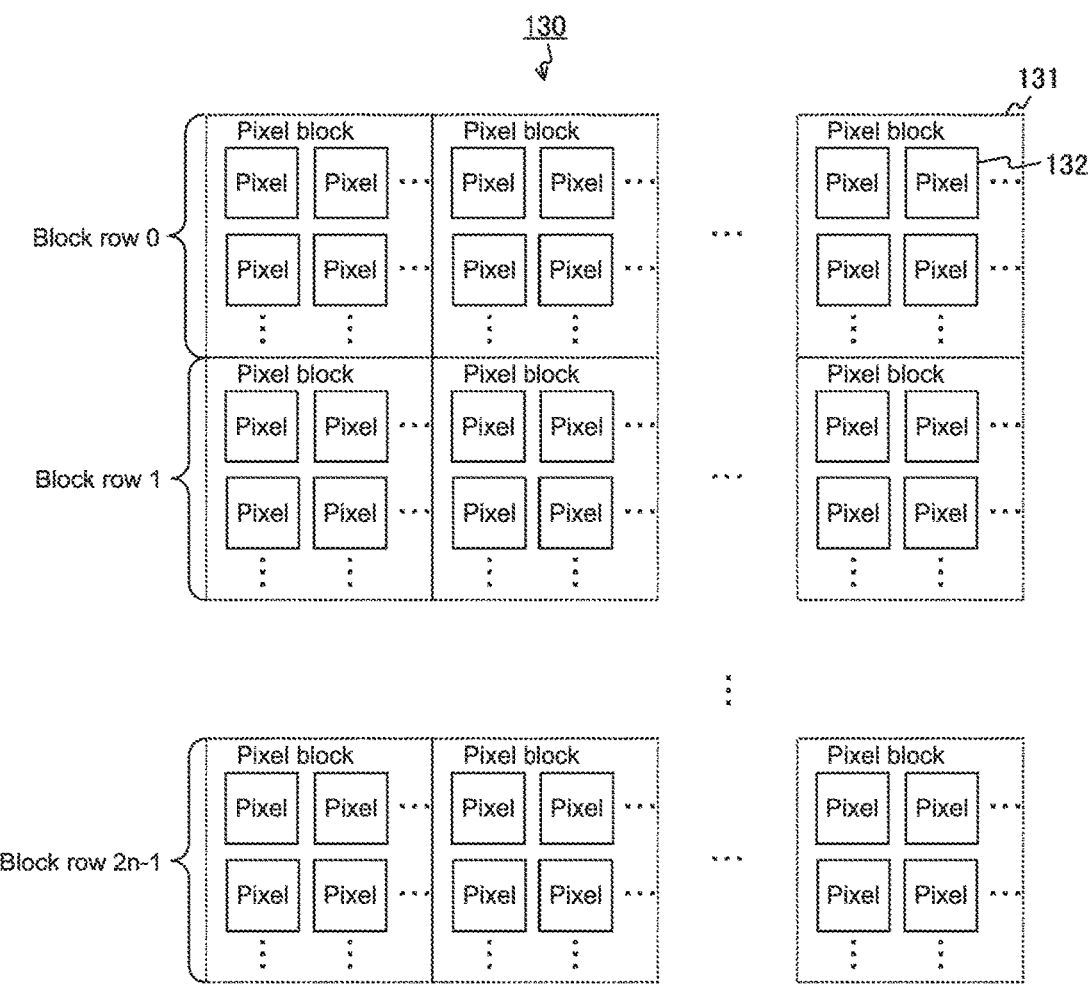
FIG. 3 is a block diagram showing one configuration example of an pixel array unit in a first embodiment.

FIG. 3 is a block diagram showing one configuration example of an pixel array unit 130 in the first embodiment. The pixel array unit 130 includes a plurality of pixels 132 arranged in a two-dimensional lattice. The pixel array unit 130 is divided into a plurality of areas each of which includes a predetermined number of pixels 132. Each area is referred to as a "pixel block 131". Hereinafter, a line including pixel blocks 131 arranged in a predetermined direction is referred to as a "block row". The aforementioned AD converting unit in the ADC array unit 300 is disposed for each pixel block 131, and the ADC row is disposed for each block row.
[Configuration Example of Row Selection Circuit]

Figure 4:
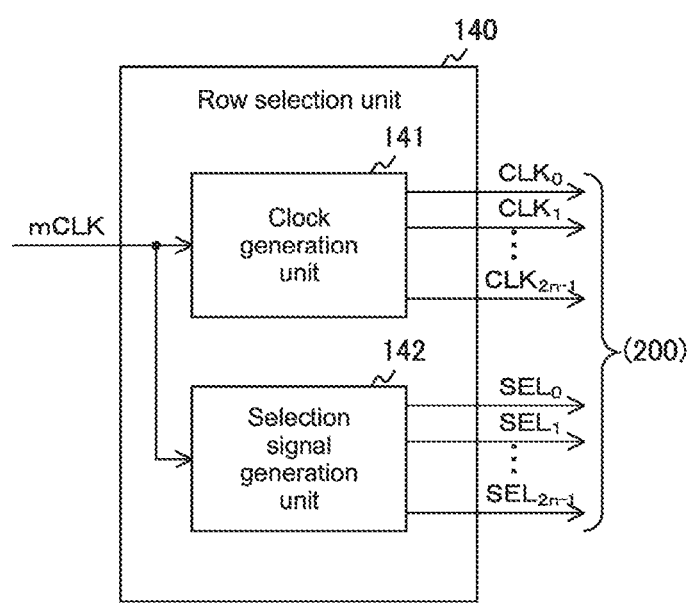
FIG. 4 is a block diagram showing one configuration example of a row selection circuit in a first embodiment.

FIG. 4 is a block diagram showing one configuration example of a row selection circuit 140 in the first embodiment. The row selection unit 140 includes a clock generation unit 141 and a selection signal generation unit 142.

The clock generation unit 141 synchronizes with a master clock signal mCLK and generates clock signals $CLK_0$ to $CLK_{2n-1}$ (n is an integer). Here, the clock signal $CLK_k$ (k is an integer of 0 to 2n−1) is a signal showing an output timing of a digital signal generated in the $k^{th}$ ADC row. The clock generation unit 141 is one example of the timing signal generation unit as described in claims.

The selection signal generation unit 142 synchronizes with a master clock signal mCLK, and generates selection signals $SEL_0$ to $SEL_{2n-1}$. Here, the selection signal $SEL_k$ is a signal for selecting a driver in the $k^{th}$ ADC row. For example, the selection signal. $SEL_k$ includes an enable signal and s+1 (s is an integer) bit select signals $bSEL_k[p]$ (p is an integer from 0 to s). Here, the enable signal is a signal that allows a selected driver to output data, and the bit select signal $bSEL_k[p]$ is a signal that instructs the $p^{th}$ bit output from AD conversion results. The clock generation unit 141 supplies the signal transmission unit 200 with the generated clock signal and the selection signal. Note that it is configured such that the selection signal includes the enable signal and the bit select signal, but it is not limited to the configuration as long as the signal can control data output.
[Configuration Example of Signal Transmission Unit]

Figure 5:
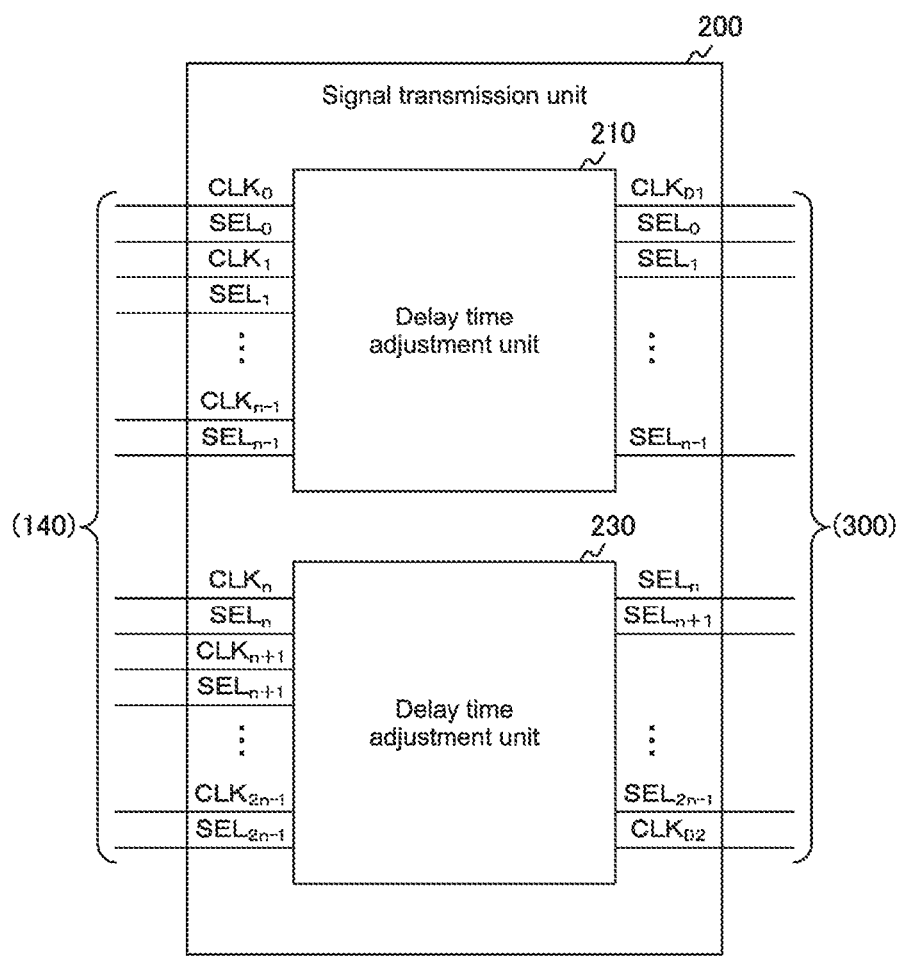
FIG. 5 is a block diagram showing one configuration example of a signal transmission unit in a first embodiment.

FIG. 5 is a block diagram showing one configuration example of a signal transmission unit 200 in the first embodiment. The signal transmission unit 200 includes delay time adjustment units 210 and 230.

The delay time adjustment unit 210 adjusts delay times of the clock signal and the selection signal to 0 to n−1$^{th}$ ADC rows. The delay time adjustment unit 210 generates a clock signal $CLK_{D1}$ from the clock signals $CLK_0$, to $CLK_{n-1}$. Also, the delay time adjustment unit 210 delays and supplies the ADC array unit 300 with the selection signals $SEL_0$ to $SEL_{n-1}$ together with the clock signal $CLK_{D1}$.

The delay time adjustment unit 230 adjusts the delay times of the clock signal and the selection signal to n to $2n-1^{th}$ ADC rows. The delay time adjustment unit 210 generates a clock signal. $CLK_{D2}$ from the clock signal $CLK_n$ to $CLK_{2n-1}$. Also, the delay time adjustment unit 230 delays and supplies the ADC array unit 300 with the selection signal $SEL_n$ to $SEL_{2n-1}$ together with the clock signal $CLK_{D2}$.

[Configuration Example of Delay Time Adjustment Unit]

Figure 6:
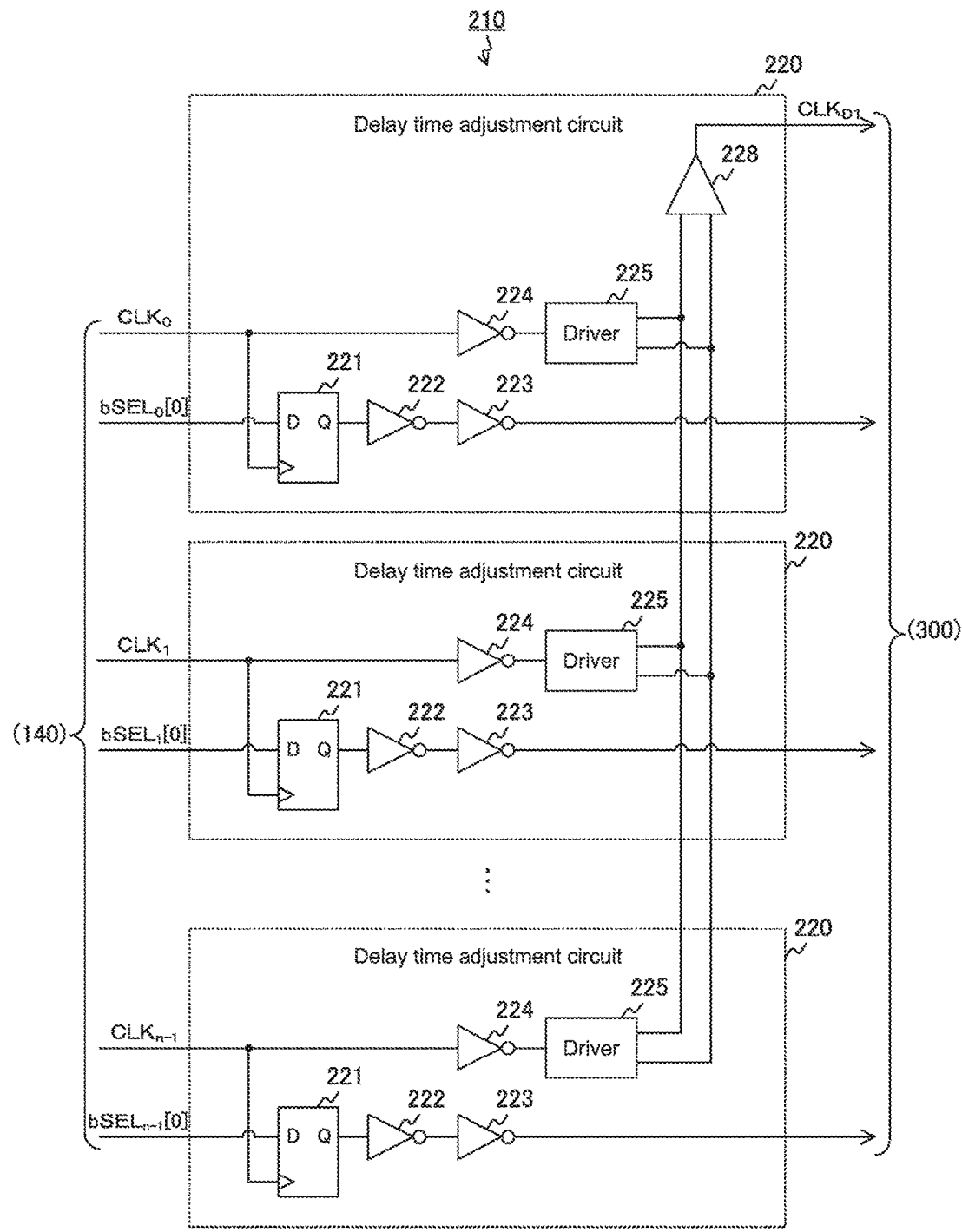
FIG. 6 is a circuit diagram showing one configuration example of a delay time adjustment unit corresponding to 0 to $n-1^{th}$ ADC rows in a first embodiment.

FIG. 6 is a circuit diagram showing one configuration example of the delay time adjustment unit 210 corresponding to 0 to $n-1^{th}$ ADC rows in the first embodiment. The delay time adjustment unit 210 includes a delay time adjustment circuit 220 for each ADC row. Each delay time adjustment circuit 220 includes a flip flop 221, inverters 222, 223 and 224, and a driver 225. Only the delay time adjustment circuit 220 corresponding to $0^{th}$ ADC row further includes an amplifier 228. An input terminal of the amplifier 228 is connected commonly to an output terminal of the driver 225 corresponding to 0 to $n-1^{th}$ ADC row. Note that the inverters 222 and 223 may not be included, and are inserted as necessary.

The flip flop 221 synchronizes with the clock signal $CLK_k$ (such as $CLK_0$), and holds and outputs a bit select signal $bSEL_k[p]$ in the selection signal $SEL_k$.

The inverters 222 and 223 supply the ADC array unit 300 with the bit select signal $bSEL_k[p]$ from the flip flop 221. The inverter 224 delays and supplies the driver 225 with a single-end clock signal $CLK_k$. If the selection signal $SEL_k$ includes the enable signal and s numbers of bit. select signals, the flip flop 221 and the inverters 222 and 223 are disposed for each signal. In FIG. 6, for convenience of description, any of which, other than the flip flop 221 corresponding to the bit select signal $bSEL_k[0]$ within the selection signal $SEL_k$, is omitted.

The driver 225 attenuates an amplitude of the clock signal $CLK_k$ from the inverter 224 by a predetermined attenuation ratio, and provides a single-end or differential output. In FIG. 6, there is the differential output. The amplifier 228 attenuates an amplitude of the clock signal $CLK_k$ by a predetermined attenuation ratio of the driver 225. For example, if the attenuation ratio is −10 decibels (dB) in decibels, the attenuation ratio is set to +10 decibels (dB). As the amplifier 228, for example, a current-input sense amplifier is used. The amplifier 228 single-end outputs the clock signal $CLK_k$ having the amplitude returned to original to the ADC array unit 300 as the clock signal $CLK_{D1}$. Although the current-input amplifier 228 is used, a voltage input amplifier may be used instead. However, if it is operated at a high speed, the current-input amplifier is desirably used.

The driver 225 is one example of the timing signal attenuation driver as described in claims. In addition, amplifier 228 is one example of the timing signal amplifying unit as described in claims.

Configuration Example of Driver

Figure 7:
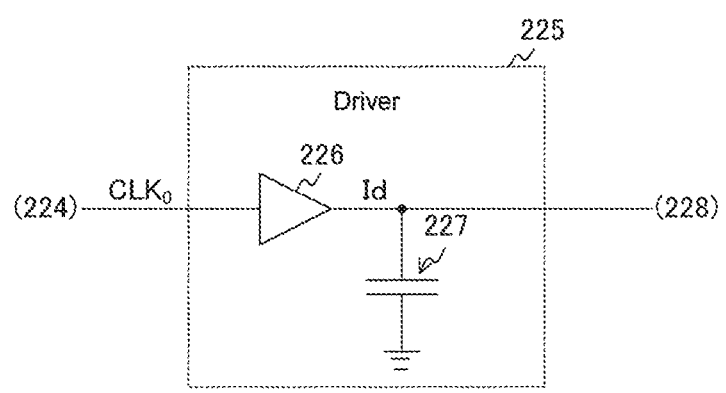
FIG. 7 is a circuit diagram showing one configuration example of a driver in a first embodiment.

FIG. 7 is a circuit diagram showing one configuration example of a driver 225 in the first embodiment. The driver 225 includes an amplifier 226 and a capacitance 227. The output from the driver 225 may be any of the differential output and the single-end output, as described above. In FIG. 7, it is the single-end output.

The amplifier 226 outputs an output current Id depending on a voltage level of the clock signal $CLK_k$ (such as $CLK_0$). The capacitance 227 discharges and charges an output current of the amplifier 226.

Here, if the output current of the amplifier 226 is denoted as Id, the value of the capacitance 227 is denoted as C, the voltage after the attenuation is denoted as $V_0$, and a charge time from 0 volt to $V_0$ volt is denoted as $t_0$, the following relational expression is established among them. A unit of Id is, for example, ampere (A), and a unit of C is, for example, farad (F). A unit of $V_0$ is, for example, volt (V), and a unit of $t_0$ is, for example, second (s).

$$Id \times t_0 = C \times V_0 \qquad \text{Numerical Expression 1}$$

When the above-described expression is transformed, the following expression is provided. Here, a duty ratio of the clock signal $CLK_k$ is defined as 0.5.

$$Id = C \times V_0/t_0 = C \times V_0 \times 2f_{CLK} \qquad \text{Numerical Expression 2}$$

In the above expression, $f_{CLK}$ represents a frequency of the clock signal $CLK_k$.

From Numerical Expression 2, the higher the frequency $f_{CLK}$ of the clock signal $CLK_k$ is, the higher the output current Id of the driver 225 is. Accordingly, the higher the frequency $f_{CLK}$ of the clock signal $CLK_k$ is, the higher the power consumption of the transmission circuit including the driver 225 and the amplifier 228 is.

Figure 8:
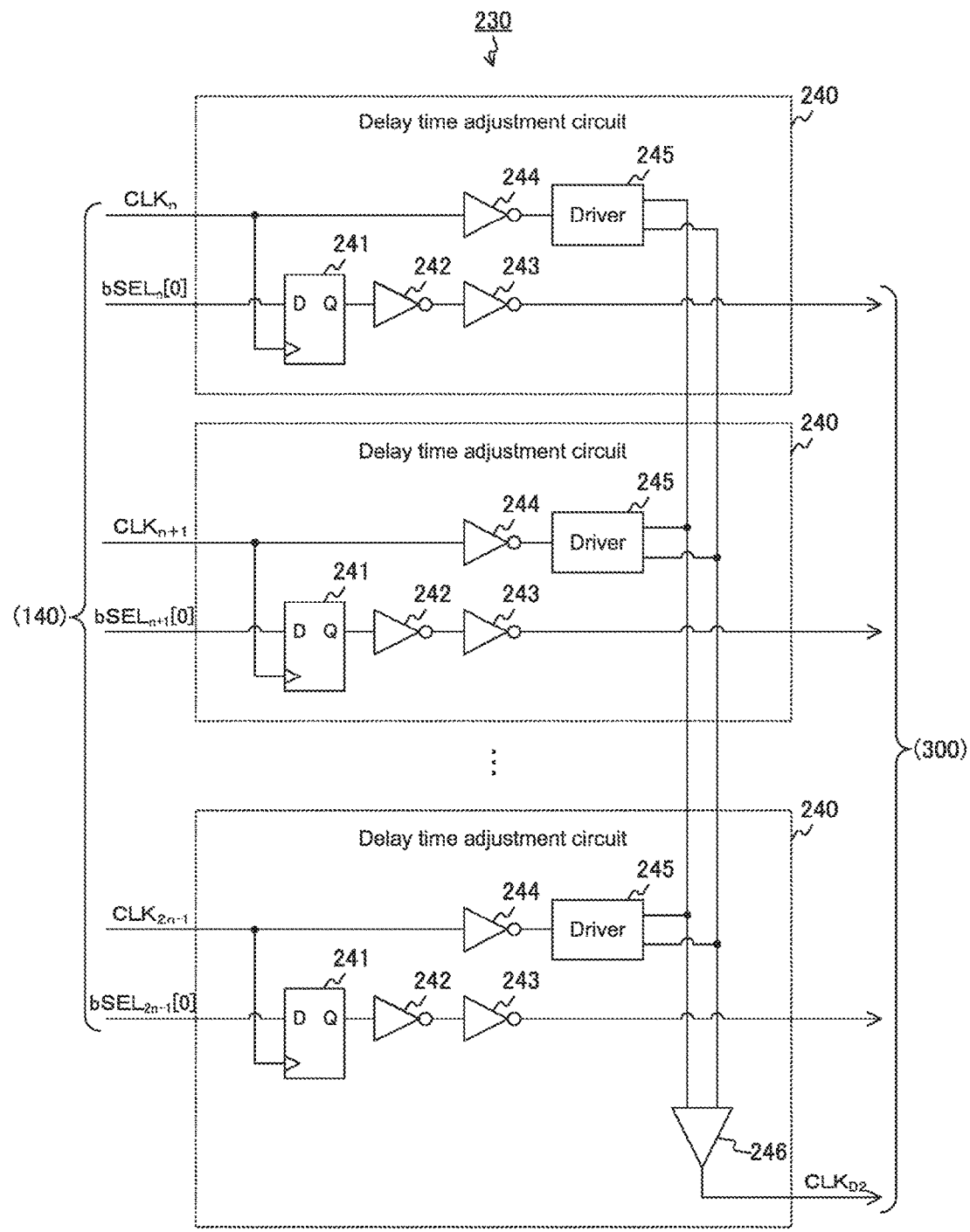
FIG. 8 is a circuit diagram showing one configuration example of a delay time adjustment unit corresponding to n to $2n-1^{th}$ ADC rows in a first embodiment.

FIG. 8 is a circuit diagram showing one configuration example of the delay time adjustment unit 230 corresponding to n to $2n-1^{th}$ ADC rows in the first embodiment. The delay time adjustment unit 230 includes a delay time adjustment circuit 240 for each ADC row. Each delay time adjustment circuit 240 includes a flip flop 241, inverters 242, 243 and 244, and a driver 245. Only the delay time adjustment circuit 220 corresponding to $2n-1^{th}$ ADC row further includes an amplifier 246. An input terminal of the amplifier 246 is connected commonly to an output terminal of the driver 245 corresponding to n to $2n-1^{th}$ BC row.

[Configuration Example of Pixel Array Unit]

Figure 9:
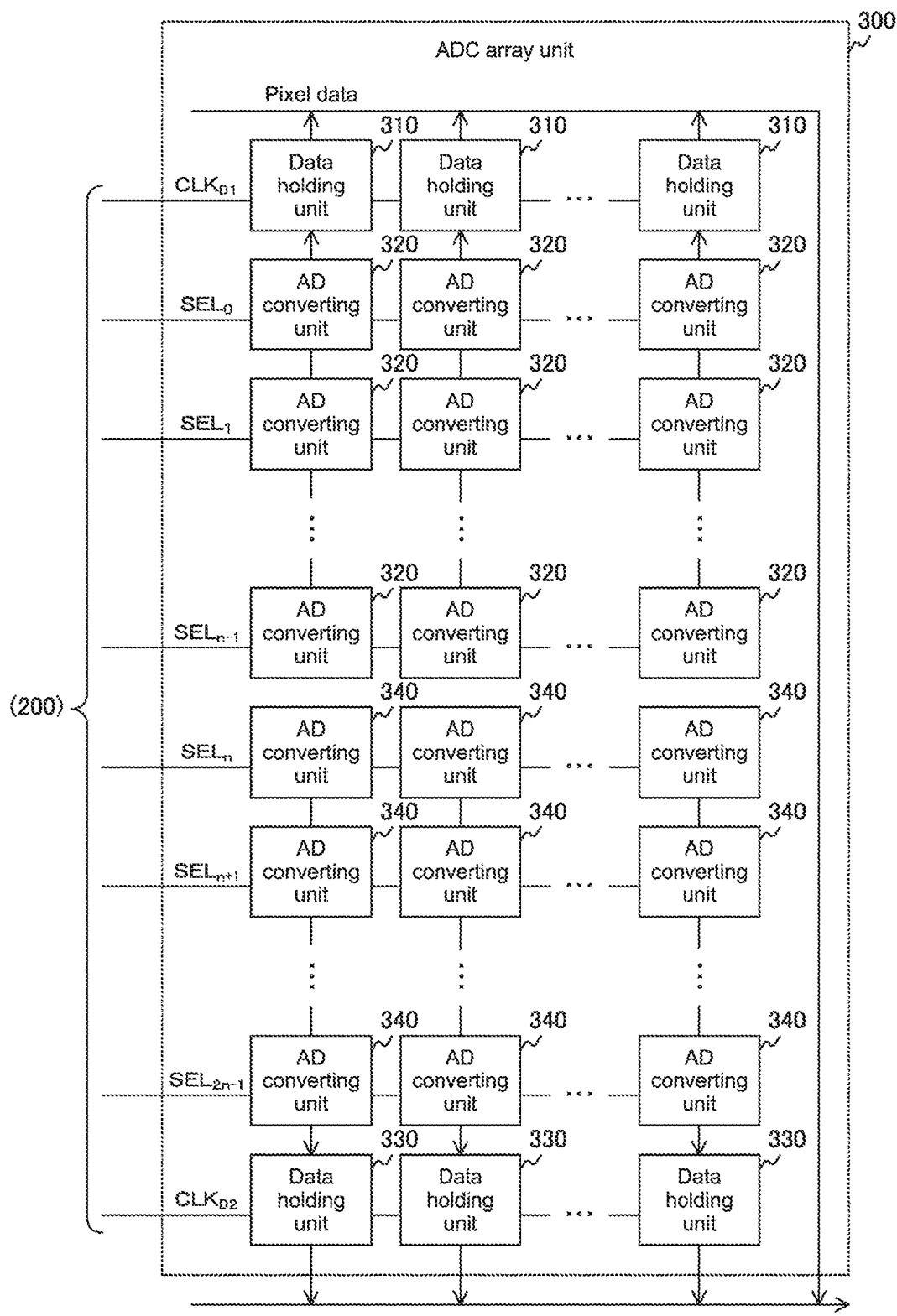
FIG. 9 is a block diagram showing one configuration example of an ADC array unit in a first embodiment.

FIG. 9 is a block diagram showing one configuration example of an ADC array unit 300 in the first embodiment. The ADC array unit 300 includes AD converting units 320 and 340 arranged in a two-dimensional lattice, a plurality of data holding units 310, and a plurality of data holding units 330. The AD converting units 320 are arranged at 0 to n−1 rows, and the AD converting units 340 are arranged at n to 2n−1 rows. The AD converting units 320 and 340 are disposed directly under the corresponding pixel blocks 131. In this manner, by arranging the AD converting units 320 and 340 for each pixel block 131, a transmission time from the pixel block 131 to the AD converting unit 320 or the like is minimized, thereby improving a read speed of pixel data.

Although it is configured such that the AD converting unit 320 or 340 is disposed for each pixel block 131, the AD converting units 320 or 340 may be disposed for each pixel 132.

The data holding units 310 and 330 are disposed for each ADC column such that a column including AD converting units 320 and 340 arranged in a direction perpendicular to the ADC line is denoted as an "ADC row". The data holding unit 310 is arranged adjacent to $0^{th}$ ADC row, and the data holding unit 330 is arranged adjacent to $2n-1^{th}$ ADC row.

The AD converting units 320 and 340 AD-convert analog pixel signals from the corresponding pixel blocks 131, and generate the pixel data. The AD converting unit 320 supplies the corresponding data holding unit 310 with the pixel data, and the AD converting unit 340 supplies the corresponding data holding unit 330 with the pixel data. The circuit including the AD converting units 320 and 340 is one example of the data signal supply unit as described in claims.

The data holding unit 310 synchronizes with the clock signal $CLK_{D1}$, holds the pixel data, and outputs the pixel data externally. The data holding unit 330 synchronizes with the clock signal $CLK_{D2}$, holds the pixel data, and outputs the pixel data externally.

Although the AD converting units 320 and 340 are arranged in a two-dimensional lattice, it may be configured such that only one row of each of the AD converting units 320 and 340 is disposed. Also, one of the AD converting units 320 and 340 may be disposed. In this case, only one of the data holding units 310 and 330 corresponding thereto may be disposed.

[Configuration Example of AD Converting Unit]

Figure 10:
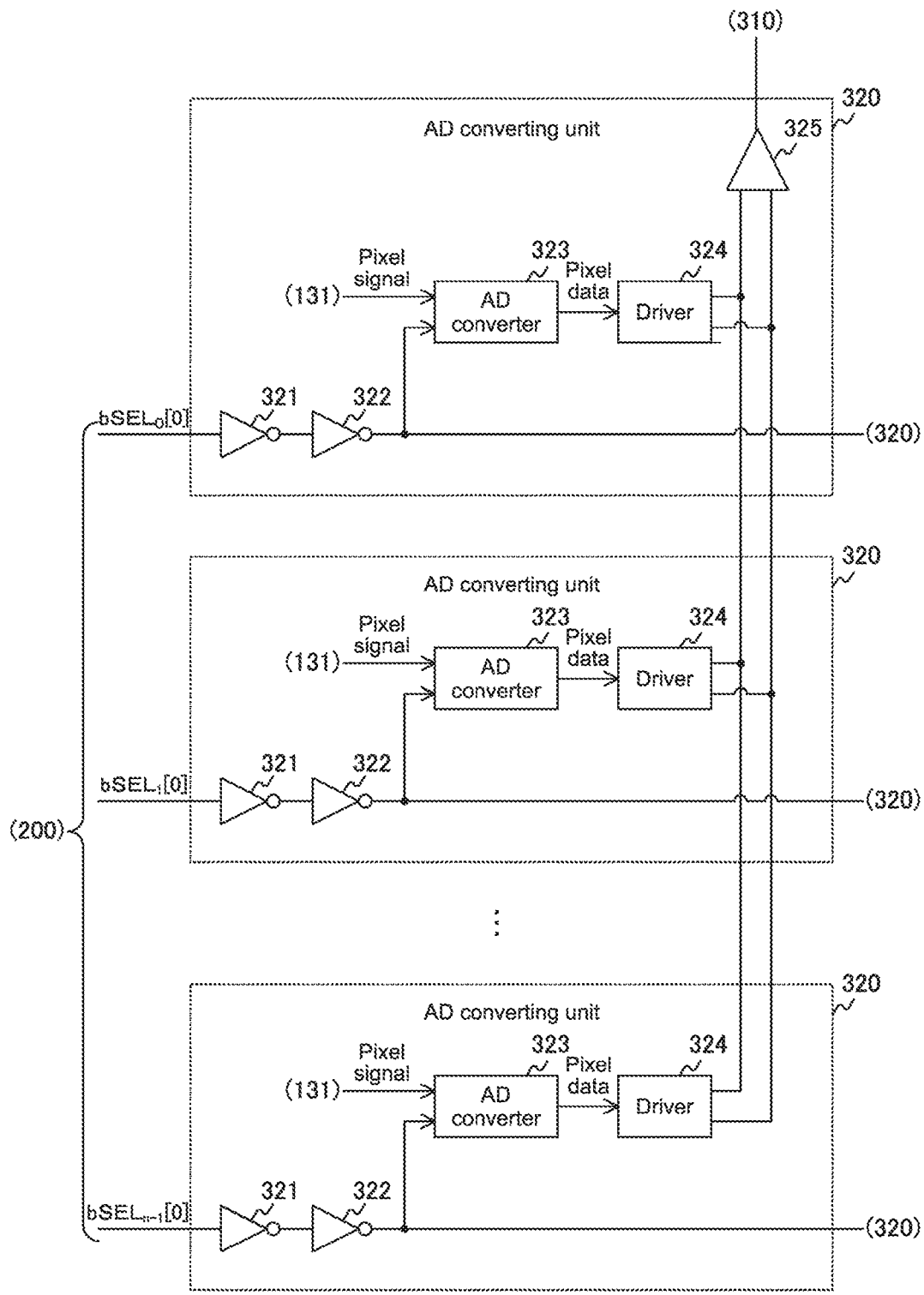
FIG. 10 is a block diagram showing one configuration example of 0 to n–1 rows of the AD converting units in a first embodiment.

FIG. 10 is a block diagram showing one configuration example of 0 to n−1 row AD converting units 320 in the first embodiment. Each AD converting unit 320 includes inverters 321 and 322, an AD converter 323, and a driver 324. Only the AD converting unit 320 in 0 row further includes an amplifier 325. An input terminal of the amplifier 325 is connected commonly to an output terminal of the driver 324 in 0 to n−1 row. An output terminal of the amplifier 325 is connected to the corresponding data holding unit 310.

The inverters 321 and 322 delay the bit select signal $bSEL_k[p]$ in the selection signal $SEL_k$ (such as $SEL_0$), and supplies the AD converter 323 and the next column with the bit select signal. If the selection signal SEL, includes the enable signal and an s numbers of the bit select signals, the inverters 321 and 322 are disposed for each signal. In FIG. 10, for convenience of description, any of which, other than the corresponding inverters 321 corresponding to the bit select signal $bSEL_k[0]$ within the selection signal $SEL_k$, is omitted.

The AD converter 323 AD-converts a pixel signal from the corresponding pixel block 131. If the bit select signal $bSEL_k[p]$ is in a high level, the AD converter 323 supplies the driver 324 with the $p^{th}$ bit of the pixel data generated by the AD conversion. The driver 324 is selected by the selection signal $SEL_k$, and the pixel data is outputted from the driver 324. The AD converter 323 is one example of the data signal production circuit as described in claims.

The driver 324 and the amplifier 325 have the configurations similar to those of the diver 225 and the amplifier 228 except that they transmit the pixel data instead of the clock signal.

The driver 324 is one example of the data signal attenuation driver as described in claims. The amplifier 325 is one example of the signal amplifying unit as described in claims data.

Figure 11:
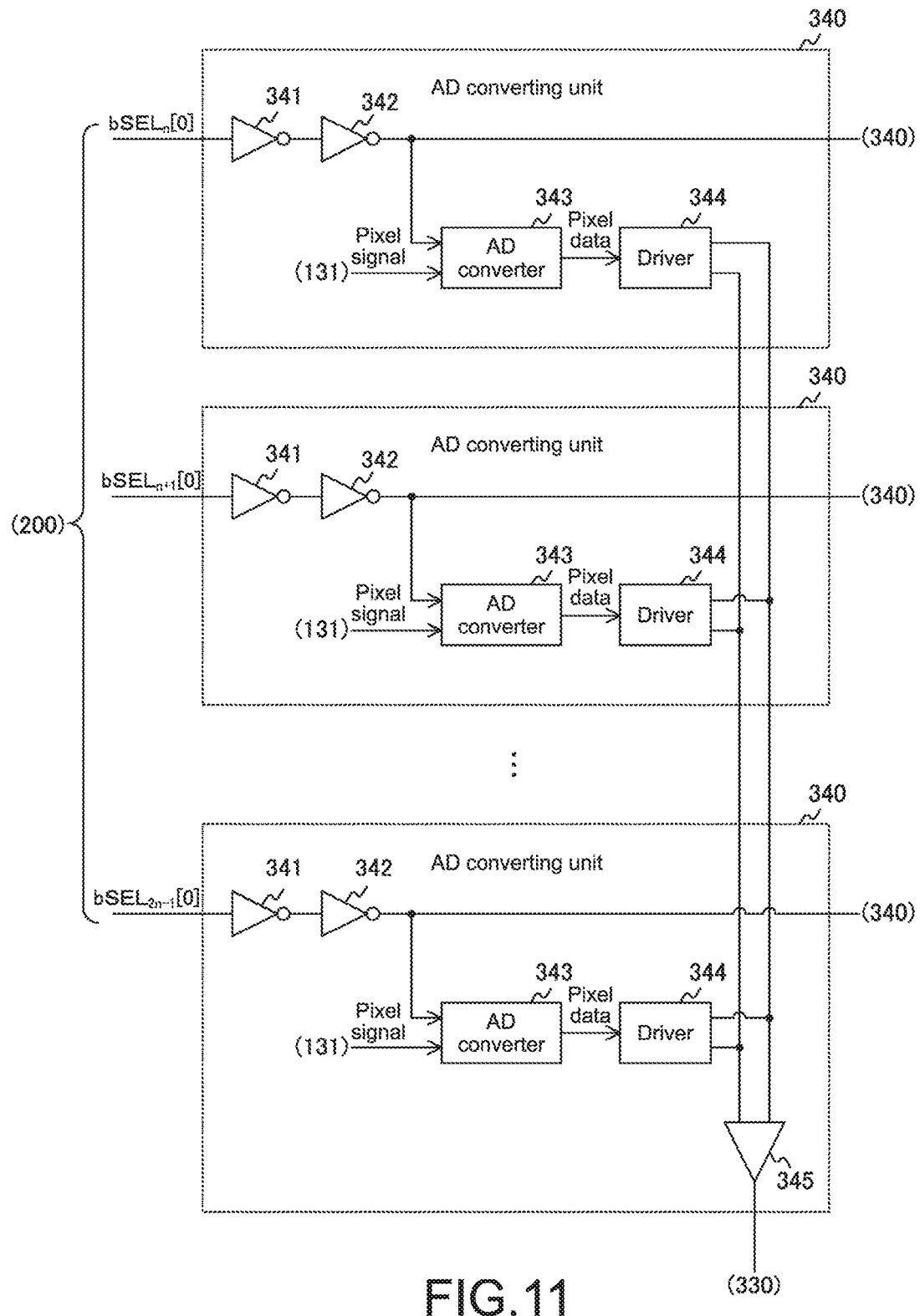
FIG. 11 is a block diagram showing one configuration example of n to 2n–1 rows of the AD converting units in a first embodiment.

FIG. 11 is a block diagram showing one configuration example of the AD converting units 340 in n to 2n−1 rows in the first embodiment. Each AD converting unit 340 includes inverters 341 and 342, an AD converter 343, and a driver 344. Only the AD converting unit 340 in 2n−1 row further includes an amplifier 345. An input terminal of the amplifier 345 is connected commonly to an output terminal of the driver 344 in n to 2n−1 rows. An output terminal of the amplifier 345 is connected to the corresponding data holding unit 330.

[Operational Embodiment of Image Sensor]

Figure 12:
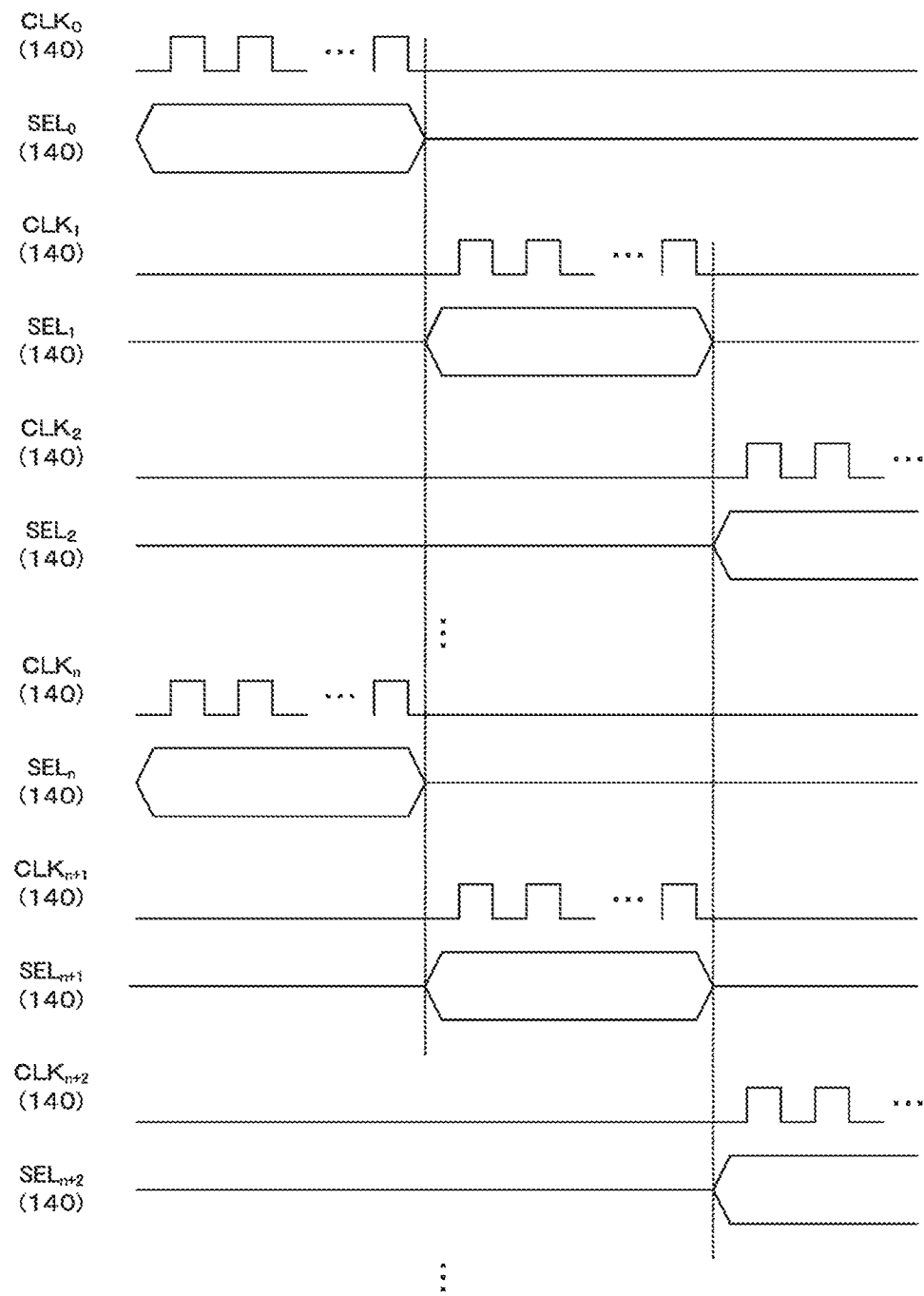
FIG. 12 is a timing chart showing one example of an output operation of a clock signal and a selection signal in a first embodiment.

FIG. 12 is a timing chart showing one example of an output operation of the clock signal and the selection signal in the first embodiment. The row selection unit 140 selects the $0^{th}$ row and the $n^{th}$ row at the same time to supply the selection signal $SEL_0$ and $SEL_n$ and the clock signal $CLK_0$ and $CLK_n$. If the selection signal $SEL_0$ includes a plurality of bit select signals, these are supplied at a timing of synchronizing with the clock signal $CLK_0$ in the order. Next, the row selection unit 140 selects the $1^{th}$ row and the $n+1^{th}$ row at the same time to supply the selection signal $SEL_1$ and $SEL_{n+1}$ and the clock signal $CLK_1$ and $CLK_{n+1}$. Thereafter, the ADC rows are selected for each two rows.

Figure 13:
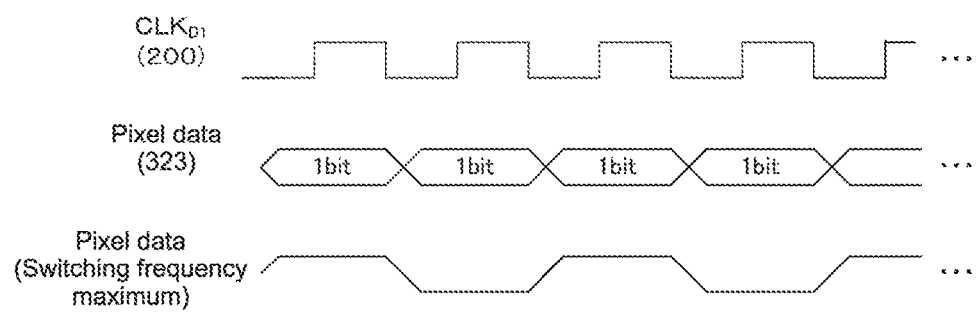
FIG. 13 is a timing chart showing one example of an output operation of a clock signal and pixel data in a first embodiment.

FIG. 13 is a timing chart showing one example of an output operation of a clock signal and pixel data in the first embodiment. As shown in FIG. 13, a plurality of bits within the pixel data is outputted from the AD converter 323 in the order. These bits are synchronized with the clock signal $CLK_{D1}$ from the signal transmission unit 200, and held by data holding unit 310 in the order.

Here, a maximum frequency of switching the output level by the driver 324 is provided if the pixel data where "1" and "0" are arranged alternately such as "101010 . . . " by a binary representation. In this case, the switching frequency $f_d$ is a half of the $f_{CLK}$, as shown in FIG. 13. Accordingly, from Numerical Expression 2, as the output current of the driver 324 is half of the driver 225 for transmitting the clock signal $CLK_k$ (such as $CLK_0$), the driver 324 can transmit the pixel data. However, if the respective output currents of the drivers 225 and 324 are different, there may be undesirably generated a difference between a transmission delay from the driver 225 to the amplifier 228 and a transmission delay from the driver 324 to the amplifier 325. Accordingly, in order that the transmission delays are substantially same, the output current of the driver 324 is set at the substantially same value of the driver 225.

Figure 14:
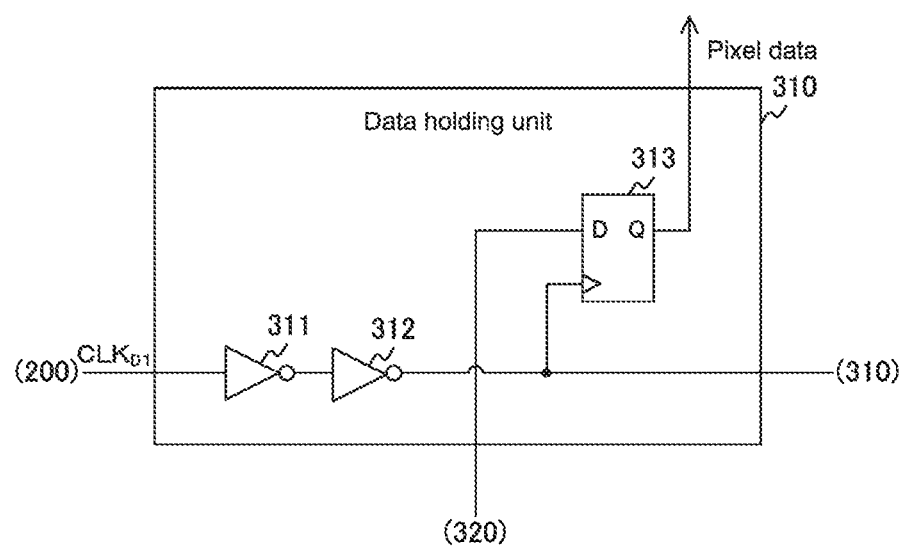
FIG. 14 is a circuit diagram showing one configuration example of a data holding unit in a first embodiment.

FIG. 14 is a circuit diagram showing one configuration example of the data holding unit 310 in the first embodiment. The data holding unit 310 includes inverters 311 and 312, and a flip flop 313. The configuration of the data holding unit 330 is the same as that of the data holding unit 310.

The inverters 311 and 312 delay the clock signal $CLK_{D1}$, which is supplied to the flip flop 313 and the next column.

The flip flop 313 synchronizes the pixel data from the AD converting unit 320 with the clock signal $CLK_{D1}$, holds the pixel data, and outputs the pixel data externally.

Figure 15:
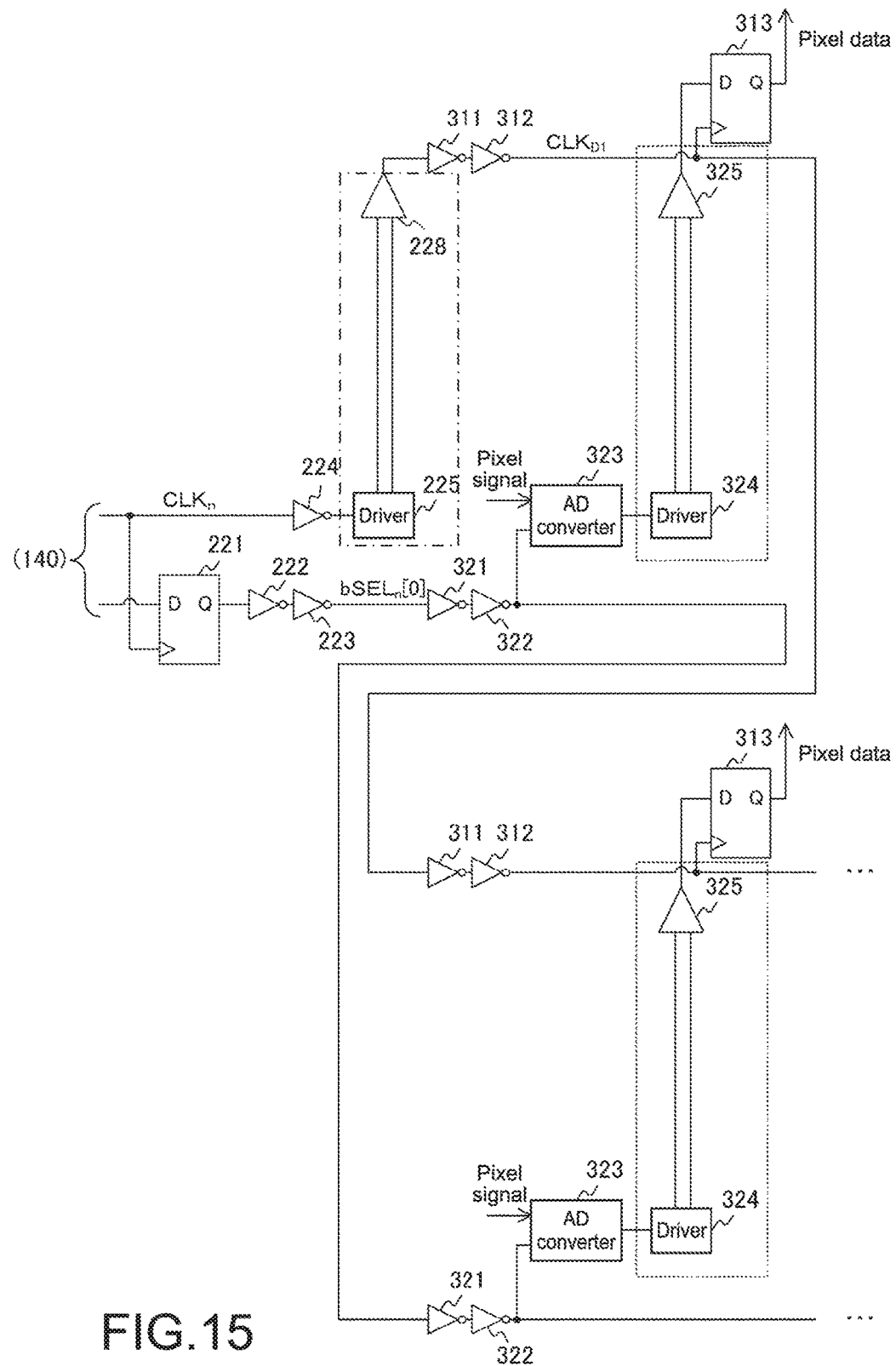
FIG. 15 is a circuit diagram showing one example of transmission paths of a clock signal and a data signal in a first embodiment.

FIG. 15 is a circuit diagram showing one example of the transmission paths of the clock signal and the data signal in the first embodiment. As shown in FIG. 15, the driver 225 attenuates the amplitude of the clock signal $CLK_k$ and outputs the amplitude to the amplifier 228, and the amplifier 228 amplifies the amplitude and returns the amplitude to original. The inverters 311 and 312 supplies the flip flop 313 with the clock signal amplified.

The flip flop 221 synchronizes with the clock signal $CLK_k$ and outputs a bit select signal $bSEL_k[p]$ to the AD converter 323, and the inverters 321 and 322 delay the bit select signal $bSEL_k$ [p] and supplies the AD converter 323 with the bit select signal. The AD converter 323 generates pixel data in accordance with the bit select signal $bSEL_k[p]$ and supplies driver 324 with the bit select signal. Then, the driver 324 attenuates the amplitude of the pixel data and outputs the amplitude to the amplifier 325, and the amplifier 325 returns the amplitude to original and supply the flip flop 313 with the amplitude.

Here, the delay time by the inverters 311 and 312 is set to the substantially same as the delay time of the inverters 321 and 322.

The flip flop 221 is one example of the control signal output unit as described in claims, the inverters 321 and 322 each is one example of the control signal delay unit as described in claims. The flip flop 313 is one example of the data signal holding circuit as described in claims. The inverters 311 and 312 each is one example of the data signal delay unit as described in claims.

The transmission circuit including the driver 225 and the amplifier 228 is one example of the timing signal transmission circuit as described in claims. The transmission circuit including the driver 324 and the amplifier 325 is one example of the data signal transmission circuit as described in claims.

The flip flop 313 synchronizes with the clock signal $CLK_{D1}$ from the amplifier 228, and holds and outputs the pixel data from the amplifier 325.

As described above, the drivers 225 and 324 attenuate the amplitude of the signal, the power consumption of the image sensor 100 can be further reduced as compared with the case that the amplitude is not attenuated.

Here, the clock signal $CLK_k$ is transmitted via the transmission circuit different from the transmission circuit of the pixel data (the driver 324 and the amplifier 325), there may be undesirably generated a difference in the transmission delays between the pixel data and the clock signal $CLK_k$, as described in Japanese Patent Application Laid-Open. No. 2011-171889. In particular, the driver 324 attenuates the amplitude, the higher the attenuation is, the greater the transmission delay is, thereby increasing the difference in the transmission delays. By the change in the conditions such as the process, the voltage and the temperature, the difference between the transmission delays is increased or decreased. Due to the difference in the transmission delays, the higher the read speed of the pixel data is, the higher the possibility that the flip flop 313 fails to hold the pixel data. As a result, the read speed is difficult to be increased.

In contrast, in the image sensor 100, the clock signal $CLK_k$ is transmitted by the transmission circuit (the driver 225 and the amplifier 228) substantially same as the transmission circuit of the pixel data, thereby significantly decreasing the difference between the transmission delays of the pixel data and the clock signal $CLK_k$. Accordingly, the read speed can be easily increased. Although the transmission circuit of the pixel data is substantially same as the transmission circuit of the clock signal, it is not limited to the configuration. Irrespective of the conditions such as the process, the voltage and the temperature, the transmission circuits of the pixel data and the clock signal may be slightly different, as long as the delay times are substantially same.

Although the transmission circuit for transmitting the clock signal (the driver 225 and the amplifier 228) is disposed adjacent along the same direction of the transmission circuit for transmitting the pixel data (the driver 324 and the amplifier 325), these may be disposed not adjacent each other.

Although each transmission circuit of the clock signal and the pixel data is configured to be disposed at the image sensor 100, each transmission circuit may be disposed at a device or an apparatus other than the image sensor 100, as long as it is synchronized with the clock signal and transmits the data signal.

Figure 16:
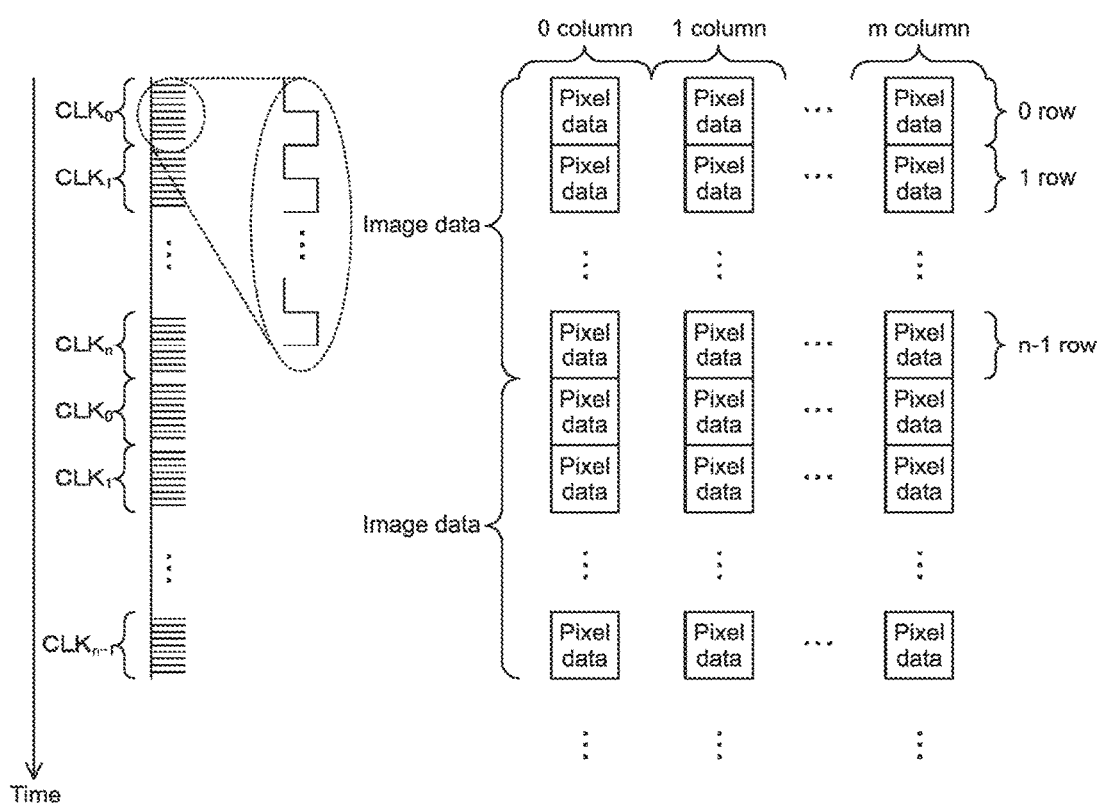
FIG. 16 is a timing chart showing one example of an output operation of a clock signal and image data in a first embodiment.

FIG. 16 is a timing chart showing one example of an output operation of a clock signal and image data in the first embodiment. The row selection unit 140 supplies the clock signal $CLK_0$ corresponding to the 0 row, and the AD converting unit 320 at the 0 row synchronizes with the clock signal $CLK_0$ and outputs the pixel data. Next, the row selection unit 140 supplies the clock signal $CLK_1$ corresponding to the 1 row, and the AD converting unit 320 synchronizes with the clock signal $CLK_1$ and outputs the pixel data. Thereafter, the clock signal corresponding to the k row is supplied in the order, and the pixel data at the k row is outputted. The clock signal and the pixel data at n to 2n−1 rows are outputted at the same time of that at the 0 to n rows. In FIG. 16, the clock signal and the pixel data at n to 2n−1 rows are omitted for convenience of description.

By outputting the pixel data at 2n rows, one image data is generated. If a plurality of image data is generated, outputting pixel data for 2n rows is repeated.

Figure 17:
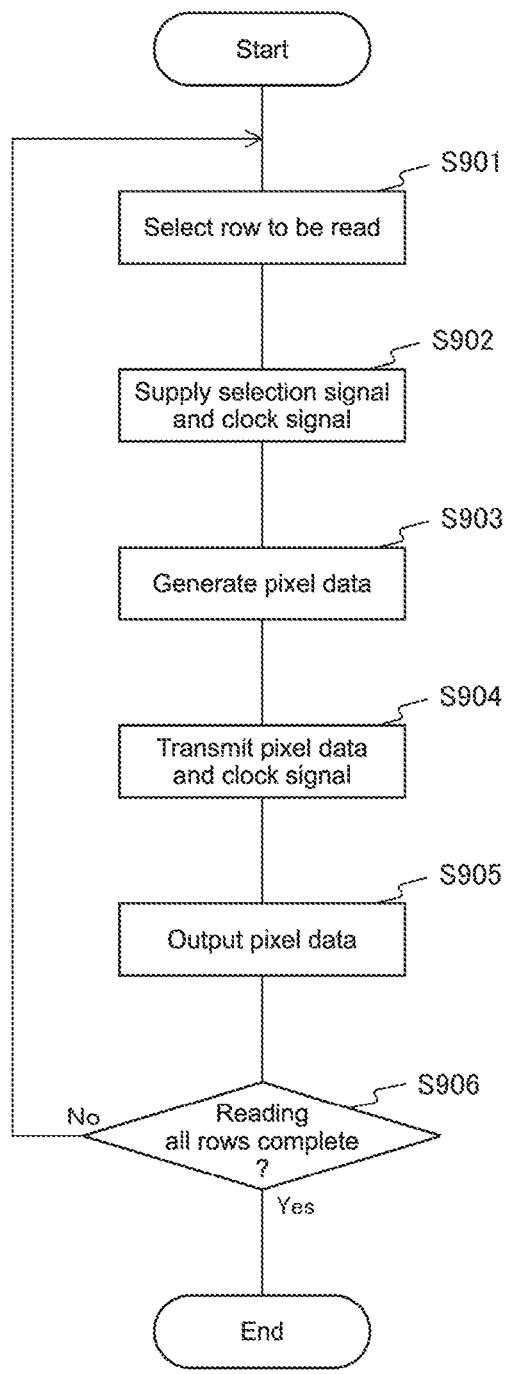
FIG. 17 is a flow chart showing one example of an operation of an image sensor in a first embodiment.

FIG. 17 is a flow chart showing one example of an operation of the image sensor 100 in the first embodiment. The operation is started when the control signal for capturing an image is inputted to the image sensor 100, for example.

Firstly, the row selection unit 140 in the image sensor 100 selects the row to be read in the ADC array unit 300 (step S901). The row selection unit 140 generates the selection signal and the clock signal, which are supplied to the ADC array unit 300 (step S902). According to the selection signal, the ADC array unit 300 generates the pixel data (step S903). The AD converter 323 within the ADC array unit 300 transmits the pixel data and the clock signal to the flip flop 313 (step S904), and the flip flop 313 synchronizes with the clock signal and outputs the pixel data (step S905).

Then, the row selection unit 140 determines whether or not reading all rows is completed (step S906). If reading all rows are not completed (step S906:No), the image sensor 100 reads step S901 or later. If reading all rows are completed (step S906:Yes), the image sensor 100 ends the operation for capturing image.

Accord in to the first embodiment of the present disclosure, as the image sensor 100 transmits the clock signal by the circuit having the substantially same delay time as that of the transmission circuit for transmitting the pixel data, the transmission delays of the pixel data and the clock signal can be substantially matched. In this way, the read speed can be increased.

<2. Second Embodiment>

In the above-described first embodiment, the output current of the driver 324 for transmitting the pixel data is set to the substantially same value as that of the driver 225 for transmitting the clock signal in order to minimize the transmission delay. However, as described above, the minimum output current necessary for the driver 324 to transmit the pixel data is half of that of the driver 225. Accordingly, if the output current of the driver 324 for the pixel data is substantially matched with that of the driver 225 for the clock signal, two times greater power is undesirably consumed as compared with the originally necessary minimum power consumption. For this reason, it is desirable to decrease the power consumption of the transmission circuit for transmitting the pixel data (driver 324 and amplifier 325). The image sensor 100 in the second embodiment is different from that in the first embodiment in that the power consumption in the transmission circuit for transmitting the pixel data is decreased.

Figure 18:
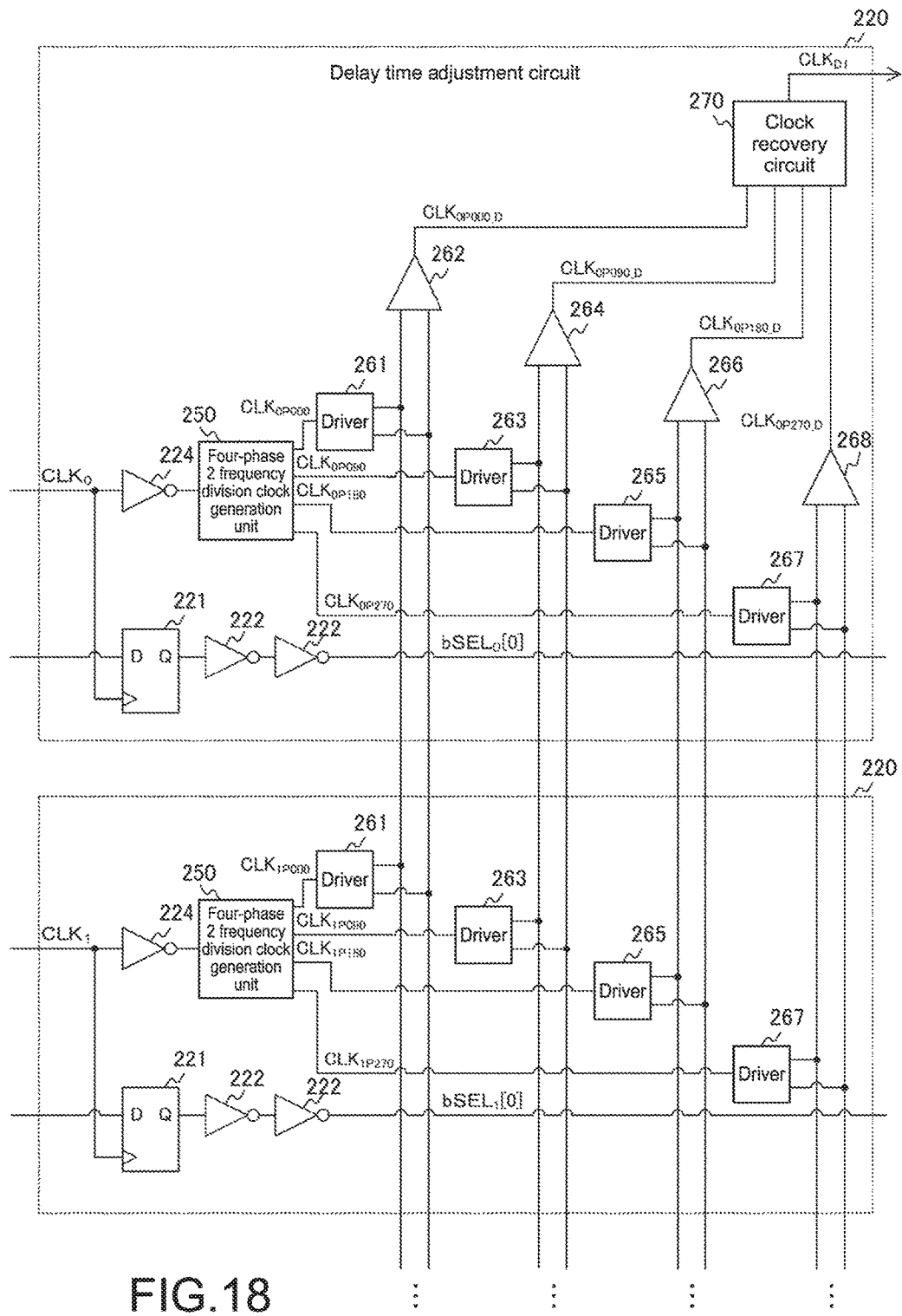
FIG. 18 is a block diagram showing one configuration example of a delay time adjustment circuit is a second embodiment.

FIG. 18 is a block diagram showing one configuration example of the delay time adjustment circuit 220 in a second embodiment. The delay time adjustment circuit 220 in the second embodiment is different from that in the first embodiment in that a four-phase 2 frequency division clock generation unit 250 and drivers 261, 263, 265 and 267 are included instead of the driver 245. In addition, in the corresponding delay time adjustment circuit 220 corresponding to the $0^{th}$ ADC row, amplifiers 262, 264, 266 and 268 and a clock recovery circuit 270 are further disposed instead of the amplifier 228. Input terminals of these amplifiers 262, 264, 266 and 268 are commonly connected to output terminals of the drivers 261, 263, 265 and 267 corresponding to the 0 to n−1 ADC rows.

The configuration of the delay time adjustment circuit 240 is the same as that of the delay time adjustment circuit 220. Specifically, the amplifier and the clock recovery circuit are disposed only at the delay time adjustment circuit 240 corresponding to the 2n−1$^{th}$ ADC rows, and n to 2n−1$^{th}$ drivers are connected to the amplifiers.

The four-phase 2 frequency division clock generation unit 250 frequency divides the clock signal $CLK_k$ ($CLK_0$) at a division ratio of 2, and multiphases into four clock signals having different phases each other.

The four clock signals are defined as $CLK_A$, $CLK_B$, $CLK_C$ and $CLK_D$, a phase difference between $CLK_A$ and $CLK_B$ is defined as Ph1, and a phase difference between $CLK_B$ and $CLK_C$ is defined as Ph2. In this case, a phase difference between $CLK_C$ and $CLK_D$ is set as Ph1, and a phase difference between $CLK_D$ and $CLK_A$ is set to Ph2. In addition, the phase difference is set so that a sum of the Ph1 and the Ph2 is 180 degrees. A ratio of the Ph1 and the Ph2 is set to a value corresponding to the duty ratio of the clock signal CLK, For example, the greater the duty ratio is, the greater the ratio of the Ph1 is set.

If the duty ratio of the clock signal $CLK_k$ is 0.5, the phase difference of the four clock signals is set to 90 degrees. In this case, the four clock signals are $CLK_{kP000}$, $CLK_{kP090}$, $CLK_{kP180}$ and $CLK_{kP270}$. The four-phase 2 frequency division clock generation unit 250 supplies the driver 261 with $CLK_{kP000}$, supplies the driver 263 with $CLK_{kP090}$, supplies the driver 265 with $CLK_{kP180}$, and supplies the driver 267 with $CLK_{kP270}$. The drivers 261, 263, 265 and 267 attenuate the amplitudes of the clock signals and supplies the amplifiers 262, 264, 266 and 268 with the amplitudes.

The four-phase 2 frequency division clock generation unit 250 is one example of the multiphase unit as described in claims.

An amplifier 262 supplies the clock recovery circuit 270 with the clock signal having the amplitude amplified as $CLK_{kp000\_D}$, and an amplifier 264 supplies the clock recovery circuit 270 with the clock signal having the amplitude amplified as $CLK_{kP090\_D}$. In addition, an amplifier 266 supplies the clock recovery circuit 270 with the clock signal having the amplitude amplified as $CLK_{kP180\_D}$, and an amplifier 268 supplies the clock recovery circuit 270 with the clock signal having the amplitude amplified as $CLK_{kP270\_D}$.

The clock recovery circuit 270 restores the signal having the same frequency and the same duty ratio as the clock signal $CLK_k$ from $CLK_{kP000\_D}$, $CLK_{kP090\_D}$, $CLK_{kP180\_D}$ and $CLK_{kP270\_D}$, and outputs as the clock signal $CLK_{D1}$. The clock recovery circuit 270 is one example of the restore unit as described in claims.

Similar to the first embodiment, in the second embodiment, as the transmission circuit for transmitting the pixel data, a circuit having the delay time substantially same as the transmission circuit for transmitting the clock signal is used. Specifically, as the driver 324 for transmitting pixel data, the same as the drivers 261, 263, 265 and 267 for transmitting the clock signal is used. Also, as amplifier 325 for transmitting the pixel data, the same as the amplifiers 262, 264, 266 and 268 for transmitting the clock signal is used.

Here, if a power consumption of each transmission circuit including the driver and amplifier is represented. by Wd, a power consumption $W_2$ of the ADC array unit 300 per row is represented by the following Numerical Expression where the ADC column is m+1 and four transmission circuits are necessary for transmitting the clock signal.

$$W_2 = (m+1+4) \times Wd \qquad \text{Numerical Expression 3}$$

In contrast, in the first embodiment, as the frequency of the clock signal is two times greater than that in the second embodiment, according to Numerical Expression 2, each power consumption of the transmission circuit is two times greater (=2Wd). In the first embodiment, one transmission circuit is necessary for transmitting the clock signal, the ADC column is m+1, the power consumption $W_1$ per row of the ADC array unit 300 is represented by the following expression:

$$W_1 = (m+1+1) \times 2Wd \qquad \text{Numerical Expression 4}$$

According to Numerical Expressions 3 and 4, if m is sufficiently great, $W_2$ is smaller than $W_1$. In this manner, by the frequency division, the power consumption can be decreased as compared with the case that no frequency division is performed.

Note that the four-phase 2 frequency division clock generation unit 250 performs both of the frequency division and the multiphasing, but may perform one of them. As described later, only the frequency division may be performed without the multiphasing, or only the multiphasing may be performed without the frequency division. In terms of decreasing the power consumption, the frequency division is desirable. In terms of keeping the duty ratio, the multiphasing is desirable.

Figure 19:
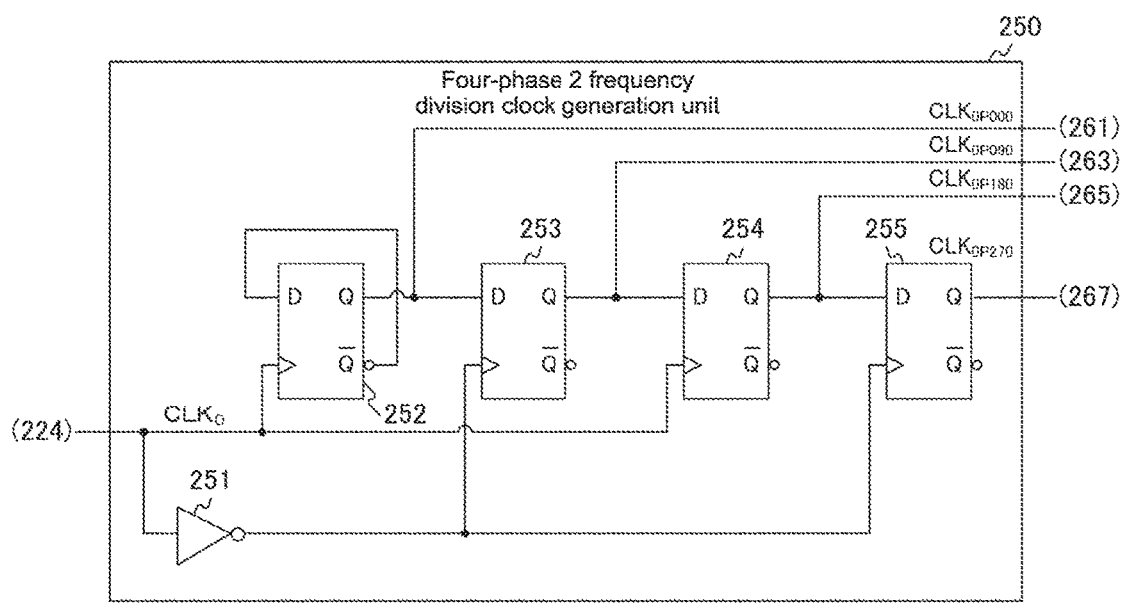
FIG. 19 is a circuit diagram showing one configuration example of a four-phase 2 frequency division clock generation unit is a second embodiment.

FIG. 19 is a circuit diagram showing one configuration example of the four-phase 2 frequency division clock generation unit 250 in the second embodiment. The four-phase 2 frequency division clock generation unit 250 includes an inverter 251 and flip flops 252, 253, 254 and 255.

The inverter 251 inputs an inverted clock signal $CLK_k$ ($CLK_0$) to clock terminals of the flip flops 253 and 255.

Each of the flip flops 252, 253, 254 and 255 includes a clock terminal, an input terminal, an output terminal, and an inverted output terminal. In FIG. 18, "D" represents the input terminal, "Q" represents the output terminal, and the "overbar Q" represents the inverted output terminal. These flip flops synchronize with the signal inputted to clock terminal, hold an input value from the input terminal, and outputs a hold value from the output terminal. From the inverted output terminal, a signal of the hold value inverted is outputted.

To the clock terminal of the flip flop 252 the clock signal $CLK_k$ is inputted, and the output terminal is connected to the input terminal of the flip flop 253 and the driver 261. In addition, the inverted output terminal of the flip flop 252 is connected to the input terminal.

The clock terminal of the flip flop 253 is connected to the inverter 251, and the output, terminal is connected to the input terminal of the flip flop 254 and the driver 263. To the clock terminal of the flip flop 254, the clock signal $CLK_k$ is inputted, and the output terminal is connected to the input terminal of the flip flop 255 and the driver 265. The clock terminal of the flip flop 255 is connected to the inverter 251, and the output terminal is connected to the driver 267.

By the configuration, the flip flop 252 generates the clock signal. $CLK_{kP00}$ by two frequency-dividing the clock signal $CLK_k$. The flip flop 253 latches the clock signal $CLK_{kP000}$ at a rise edge of the clock signal $CLK_k$ and generates a clock signal $CLK_{kP090}$ therefrom. Then, the flip flop 254 latches the clock signal. $CLK_{kP090}$ at a rise edge of the clock signal $CLK_k$ and generates a clock signal $CLK_{kP180}$ therefrom. The flip flop 255 latches the clock signal $CLK_{kp180}$ at a rise edge of the clock signal $CLK_k$ and generates a clock signal $CLK_{kP270}$ therefrom.

The configuration of the four-phase 2 frequency division clock generation unit 250 is not limited to the circuit shown in FIG. 19 as long as the two frequency division and the multiphasing are performed.

Figure 20:
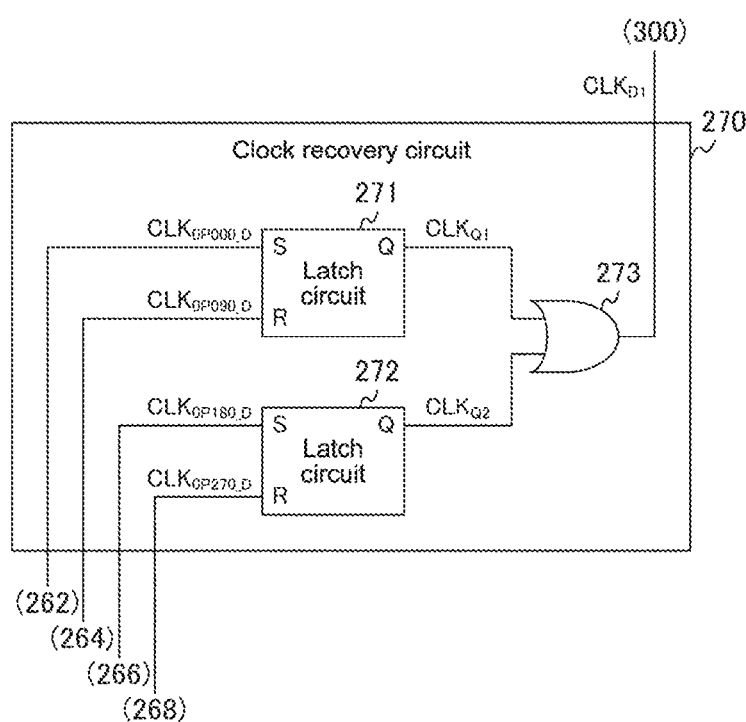
FIG. 20 is a circuit diagram showing one configuration example of a clock recovery circuit in a second embodiment.

FIG. 20 is a circuit diagram showing one configuration example of the clock recovery circuit 270 in the second embodiment. The clock recovery circuit 270 includes latch circuits 271 and 272 and an OR gate 273.

Each of the latch circuits 271 and 272 includes a set terminal S, a reset terminal R and an output terminal Q. Once a high level signal is inputted only to the set terminal S, the latch circuit sets the hold value to high, and the value is outputted from the output terminal Q. Once a high level signal is inputted only to the reset terminal R, the latch circuit sets the hold value to low, and the value is outputted from the output terminal Q. Once a low level signal is inputted to the set terminal S and the reset terminal R, the latch circuit holds the status of the hold value.

The set terminal S of the latch circuit 271 is connected to the amplifier 262 for outputting the clock signal $CLK_{kP000\_D}$, the reset terminal R is connected to the amplifier 264 for outputting the $CLK_{kP090\_D}$. The output terminal Q is connected to the input terminal of the OR gate 273. Hereinafter, the signal outputted from the latch circuit 271 is represented as an internal signal $CLK_{Q1}$, and the signal outputted from the latch circuit 271 is represented as an internal signal $CLK_{Q2}$.

The set terminal S of the latch circuit 272 is connected to the amplifier 266 for outputting the $CLK_{kP180\_D}$, and the output terminal Q is connected to the input terminal of the OR gate 273.

The latch circuits 271 and 272 each is one example of the internal signal generation unit as described in claims.

The OR gate 273 outputs a logical add of the input value. The OR gate 273 outputs the logical add of the internal signals $CLK_{Q1}$ and $CLK_{Q2}$ from the latch circuits 271 and 273 to the ADC array unit 300 as the clock signal $CLK_{D1}$. The OR gate 273 is one example of the logical add gate as described in claims.

FIG. 21 is a truth table showing one example of an operation of the latch circuit 271 in the second embodiment. Once a high level signal is inputted only to the set terminal S, the latch circuit 271 outputs a high level signal from the output terminal Q. Once a high level signal is inputted only to the reset terminal R, the latch circuit 271 outputs a low level signal from the output terminal Q. Once a low level signal is inputted to the set terminal S and the reset terminal R, the latch circuit 271 holds the status of the hold value. The operation of the latch circuit 272 is similar to that of the latch circuit 271.

Figure 22:
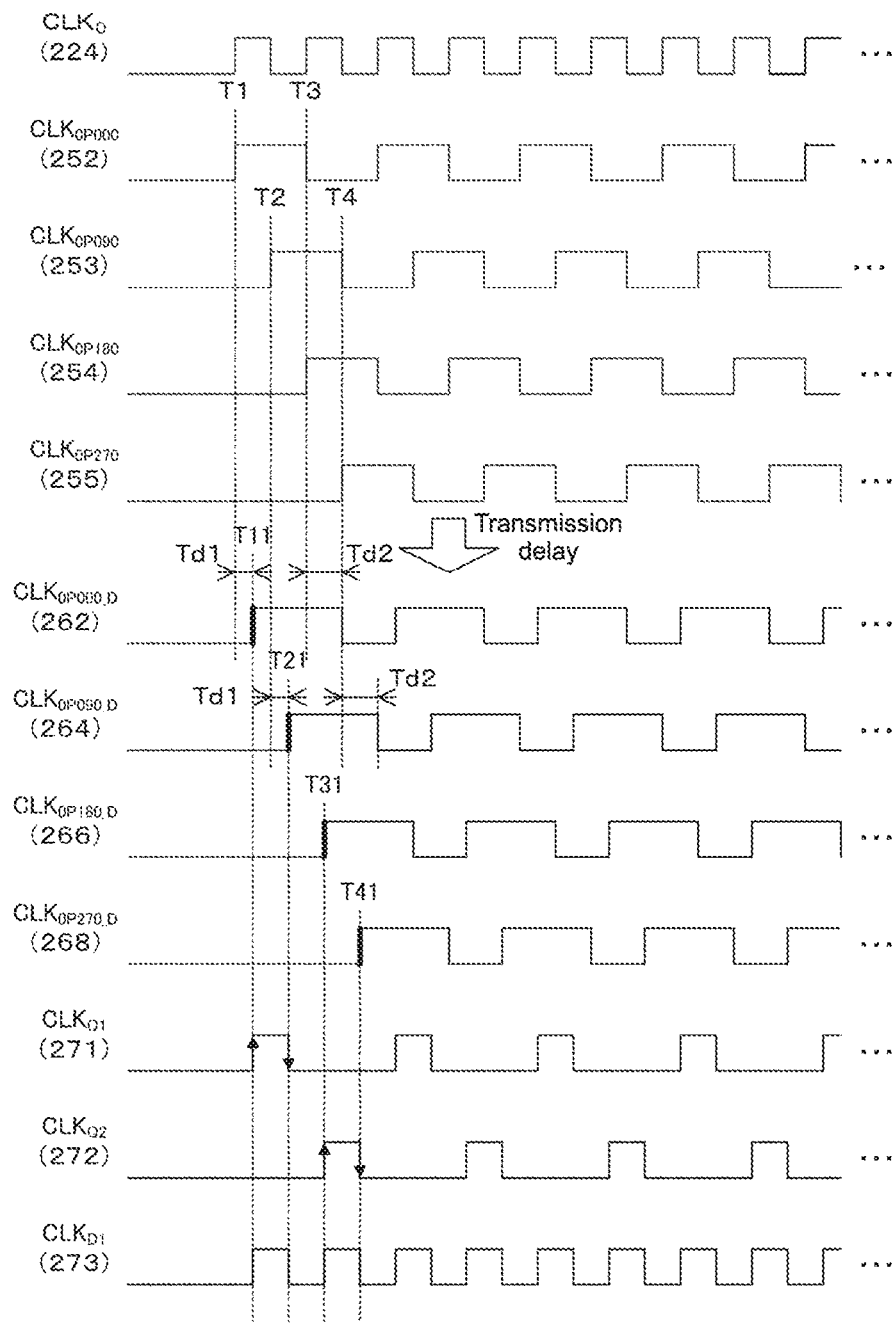
FIG. 22 is a timing chart showing one example of a delay time of a clock signal in a second embodiment.

FIG. 22 is a timing chart showing one example of a delay time of a clock signal in the second embodiment. The frequency of the clock signal $CLK_k$ ($CLK_0$) is two frequency-divided by the four-phase 2 frequency division clock generation unit 250, and is multiphased into clock signals $CLK_{kP000}$, $CLK_{kP090}$, $CLK_{kP180}$ and $CLK_{kP270}$ having different phases by 90 degrees. These clock signals are transmitted in parallel by four transmission circuits each having the driver and the amplifier.

Then, the amplifiers 262, 264, 266 and 268 output $CLK_{kP000\_D}$, $CLK_{kP090\_D}$, $CLK_{kP180\_D}$ and $CLK_{kP270\_D}$, in which rise and fall are delayed. For example, the rise of $CLK_{kP000\_D}$ is delayed from the rise of $CLK_{kP000}$ by Td1, and the fall is delayed from the fall of $CLK_{kp000}$ by Td2. As the transmission circuits are similar, each of the rise and fall of $CLK_{kP090\_D}$, $CLK_{kP180\_D}$, $CLK_{kP270\_D}$ delays from the corresponding signal before the delay by Td1 and Td2. Thus, the transmission delays of $CLK_{kP000\_D}$, $CLK_{kP090\_D}$, $CLK_{kP180\_D}$ and $CLK_{kP270\_D}$, have the same value, whereby the respective phase differences between the clock signals after delay are 90 degrees similar to those before the delay. Accordingly, by generating the signal having high level and low level periods corresponding to the phase differences (90 degrees), the original clock signal can be restored.

For example, the latch circuit 271 generates a high level internal signal $CLK_{Q1}$ for the duration from the rise of $CLK_{kP000\_D}$ (T11) to the rise of $CLK_{kP090\_D}$ (T21), and generates a low level internal signal $CLK_{Q1}$ for the other duration. The latch circuit 272 generates a high level internal signal $CLK_{Q2}$ for the duration from the rise of $CLK_{kP180\_D}$ (T31) to the rise of $CLK_{kP270\_D}$ (T41), and generates a low level internal signal $CLK<_{Q2}$ for the other duration. The OR gate 273 outputs the logical add of the internal signals $CLK_{Q1}$ and $CLK_{Q2}$. In this manner, the signal having the duty ratio and the frequency same as those before delay is restored.

If the delay times Td1 and Td2 at the rise are different and the clock signal is transmitted. without multiphasing, the duty ratio of the clock signal after the delay changes to different values. In particular, the duty ratio of the clock signal and a differential signal at a low frequency is easily changed.

In contrast, in the configuration that the four-phase 2 frequency division clock generation unit 250 multiphases into four clock signals, the phase differences are not changed after the delay, Therefore, the signal having the original duty ratio can be restored from the phase differences.

Thus, according to the second embodiment of the present disclosure, the four-phase 2 frequency division clock generation unit 250 frequency-divides the frequency of the clock signal, whereby the transmission circuit can transmit the signal having the lower frequency different from before the frequency division. As the power consumption of the transmission circuit is proportional to the frequency, the power consumption of the transmission circuit can be decreased as compared with the case that no frequency division is performed.

[First Alternative Embodiment]

In the above-described second embodiment, although the clock recovery circuit 270 restores the clock signal having the same frequency before the delay by the two latch circuits and the OR gate, the clock signal can be restored by the circuit other than the latch circuits. The clock recovery circuit 270 in a first alternative embodiment is different from the second embodiment in that the clock signal is restored by the circuit other than the latch circuits.

Figure 23:
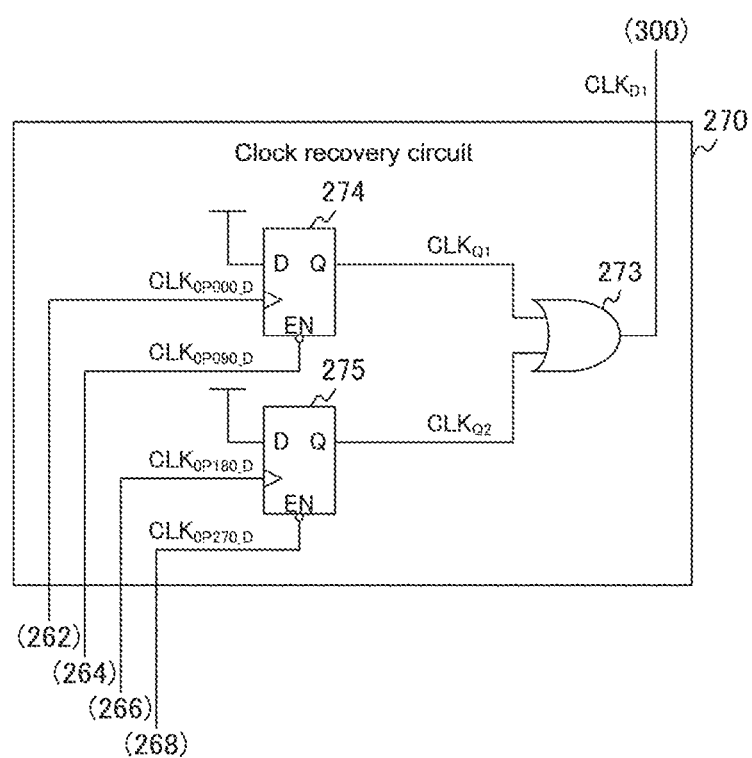
FIG. 23 is a circuit diagram showing one configuration example of a clock recovery circuit in a first alternative embodiment of a second embodiment.

FIG. 23 is a circuit diagram showing one configuration example of the clock recovery circuit 270 in the first alternative embodiment, of the second embodiment. The clock recovery circuit 270 in the first alternative embodiment is different from the second embodiment in that flip flops 274 and 275 are included instead of the latch circuits 271 and 272.

The flip flops 274 and 275 include an input terminal D, an output terminal Q, a clock terminal and an enable terminal EN. The flops synchronize with the signal inputted to the clock terminal, hold the signal inputted to the input terminal D, and output the signal from the output terminal Q, if the high level signal is inputted to an enable terminal EN. On the other hand, if the low level signal is inputted to the enable terminal EN, the flip flops output the low level signal from the output terminal Q irrespective of the input signal to the input terminal D.

To the input terminal D of the flip flop 274, a high level fixed value is inputted, the clock terminal is connected to the amplifier 262, and the output terminal Q is connected to the input terminal of the OR gate 273. To the enable terminal EN of the flip flop 274, an inverted value of the signal from the amplifier 264 is inputted.

To the input terminal D of the flip flop 275, a high level fixed value is inputted, the clock terminal is connected to the amplifier 266, and the output terminal Q is connected to the input terminal of the OR gate 273. To the enable terminal EN of the flip flop 275, an inverted value of the signal from the amplifier 268 is inputted.

By the configuration, the clock signal can be restored similar to the second embodiment.

FIG. 24 is a truth table showing one example of an operation of the flip flop 274 in the first alternative embodiment of the second embodiment.

The flip flop 274 outputs a low level signal form the output terminal Q, if the low level signal is inputted to the enable terminal EN. On the other hand, the flip flop 274 updates the hold value by a signal from the input terminal D upon the rise of the signal from the clock terminal and outputs the hold signal from the output terminal Q, if the high level signal is inputted to the enable terminal EN. During a period other than the rise of the signal from the clock terminal, the flip flop 274 holds the status of the hold value. The operation of the flip flop 275 is similar to that of the flip flop 274.

In this manner, according to a first alternative embodiment in the second embodiment of the present disclosure, as the flip flop 274 and 275 are disposed at the clock recovery circuit 270, the clock signal can be restored without using the latch circuits 271 and 272.

[Second Alternative Embodiment]

In the above-described second embodiment, the four-phase 2 frequency division clock generation unit 250 is multiphases into four clock signals having different phase differences. With the four phases, four transmission circuits are necessary. In terms of further decreasing the power consumption, it is desirable that the number of the transmission circuits is decreased. The image sensor 100 in second alternative embodiment of the second embodiment is different from the second embodiment in that the number of the transmission circuits is decreased.

Figure 25:
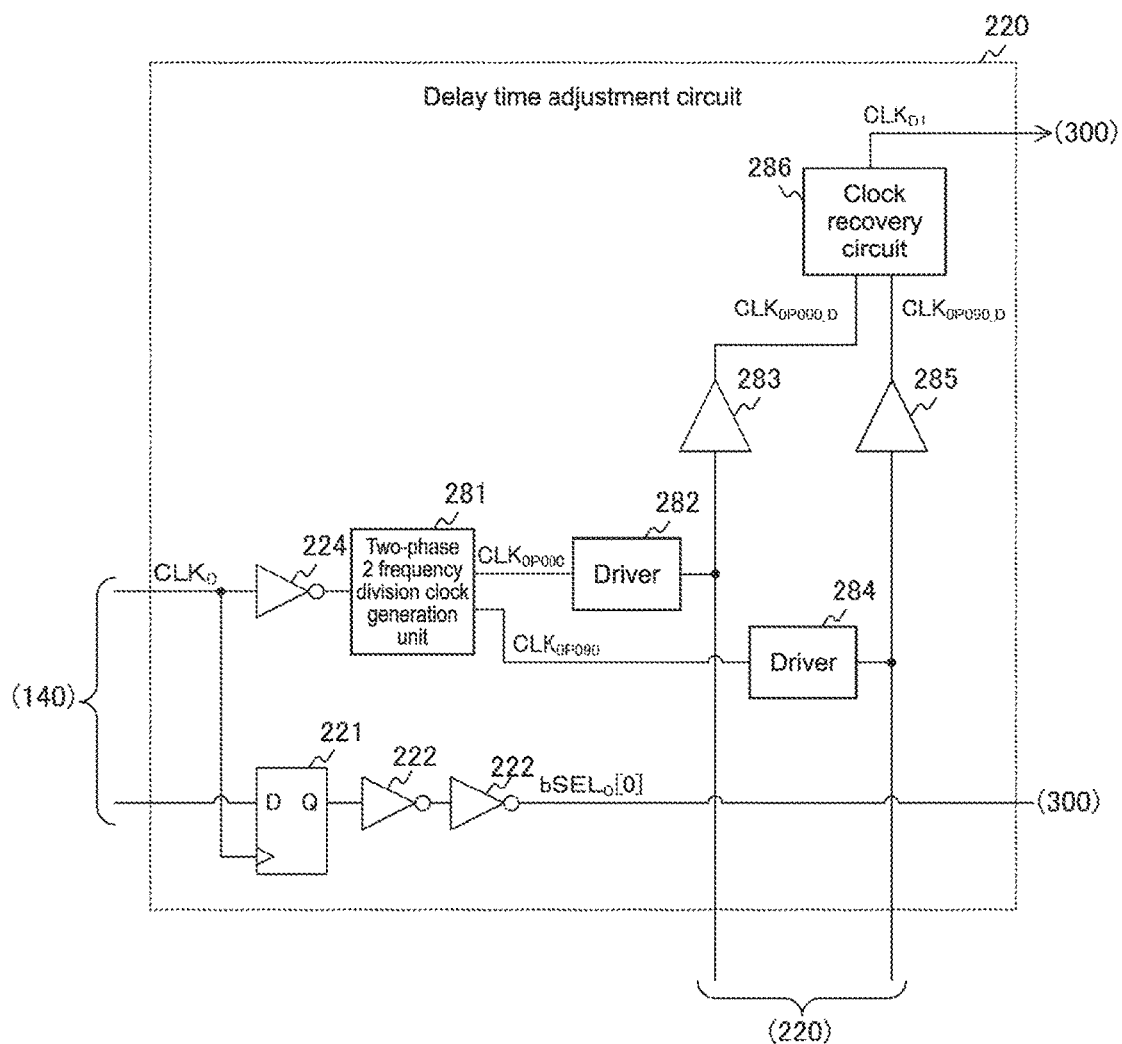
FIG. 25 is a circuit diagram showing one configuration example of a delay time adjustment circuit in a second alternative embodiment of a second embodiment.

FIG. 25 is a circuit diagram showing one configuration example of the delay time adjustment circuit 220 in the second alternative embodiment of the second embodiment. The delay time adjustment circuit 220 in the second alternative embodiment is different from the second embodiment in that the two-phase 2 frequency division clock generation unit 281 is included instead of the four-phase 2 frequency division clock generation unit 250. Also, the delay time adjustment circuit 220 in the second alternative embodiment is different from the second embodiment in that drivers 282 and 284 are included instead of the drivers 261, 263, 265 and 267. In addition, in the delay time adjustment circuit 220 corresponding to the 0$^{th}$ ADC row, amplifiers 283 and 285 and a clock recovery circuit 286 are further disposed instead of the amplifiers 262, 264, 266 and 268 and the clock recovery circuit 270. Input terminals of these amplifiers 283 and 285 are commonly connected to output terminals of the drivers 282 and 284 corresponding to the 0 to n−1 ADC rows.

The two-phase 2 frequency division clock generation unit 281 frequency-divides the clock signal $CLK_k$ at a division ratio of 2, and multipheses into four clock signals having different phases each other. The two-phase 2 frequency division clock generation unit 281 generates clock signal. $CLK_{kP00D}$ and $CLK_{kP090}$ having a phase difference of 90 degrees, for example, and provides the driver 282 with the clock signal $CLK_{kP000}$ and provides the driver 284 with the clock signal $CLK_{kP090}$.

The drivers 282 and 284 attenuates the amplitude of the clock signal to provide the single-end output. The amplifiers 283 and 285 amplify the amplitude of the clock signal to supply the amplitude to the clock recovery circuit 286. Although the drivers 282 and 284 provides the single-end output the clock signal, the drivers 282 and 284 may provide the differential output.

The clock recovery circuit 286 restores the signal having the same frequency and the same duty ratio before the delay.

Figure 26:
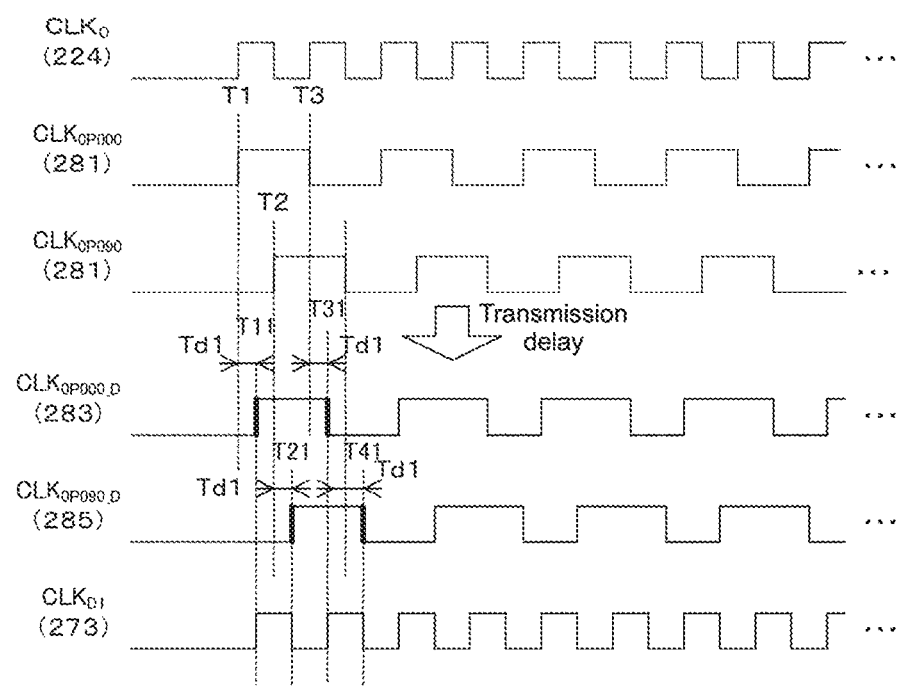
FIG. 26 is a timing chart showing one example of a delay time of a clock signal in the second alternative embodiment of a second embodiment.

FIG. 26 is a timing chart showing one example of a delay time of a clock signal in the second alternative embodiment of the second embodiment. The frequency of the clock signal $CLK_k$ ($CLK_0$) is two frequency-divided by the two-phase 2 frequency division clock generation unit 281, and is multiphased into clock signals clock signal $CLK_{kP000}$ and $CLK_{kP090}$ having different phases by 90 degrees. These clock signals are transmitted in parallel by two transmission circuits each having the driver and the amplifier.

Then, $CLK_{kP000\_D}$ and $CLK_{kP090\_D}$ in which the rise and the fall are delayed are outputted from the amplifiers 283 and 285. For example, the rise and the fall of $CLK_{kP000\_D}$ are delayed from the rise and the fall of $CLK_{kP000}$ by Td1. As the transmission circuit is similar, the rise and the fall of $CLK_{kP090\_D}$ are also delayed from a corresponding clock signal $CLK_{kP090}$ by Td1.

The clock recovery circuit 286 outputs a high level signal from the rise of $CLK_{kP000\_D}$ (such as T11) to the rise of $CLK_{kP090\_D}$ (such as T21). The clock recovery circuit 286 outputs a low level signal from the rise of $CLK_{kP090\_D}$, to the rise of $CLK_{kP000\_D}$ (such as T31). Also, the clock recovery circuit 286 outputs a high level signal from the rise of $CLK_{kP000\_D}$ to the fall of $CLK_{kP090\_D}$ (such as T41). In this manner, the signal having the same duty ratio and frequency before the delay is restored.

If it is conceivable that there arises a difference between the delay time of the rise and the delay time of the fall, it is difficult to restore the original duty ratio from the two clock signals. Therefore, it is desirable that four clock signals muitiphased are transmitted as in the second embodiment.

According to the second alternative embodiment of the second embodiment in the present disclosure, the two-phase 2 frequency division clock generation unit 281 transmits in parallel the two clock signals multiphased. As compared with the four clock signals multiphased, the number of the transmission circuits can be reduced.

[Third Alternative Embodiment]

In the above-described second alternative embodiment of the second embodiment, the two-phase 2 frequency division clock generation unit 281 multiphases into the two clock signals having different phase differences. If the phases are two, two transmission circuits are necessary. In terms of further decreasing the power consumption, it is desirable that the number of the transmission circuits are further decreased. The image sensor 100 in a third alternative embodiment of the second embodiment is different from that in the second alternative embodiment in that the number of the transmission circuits is further decreased.

Figure 27:
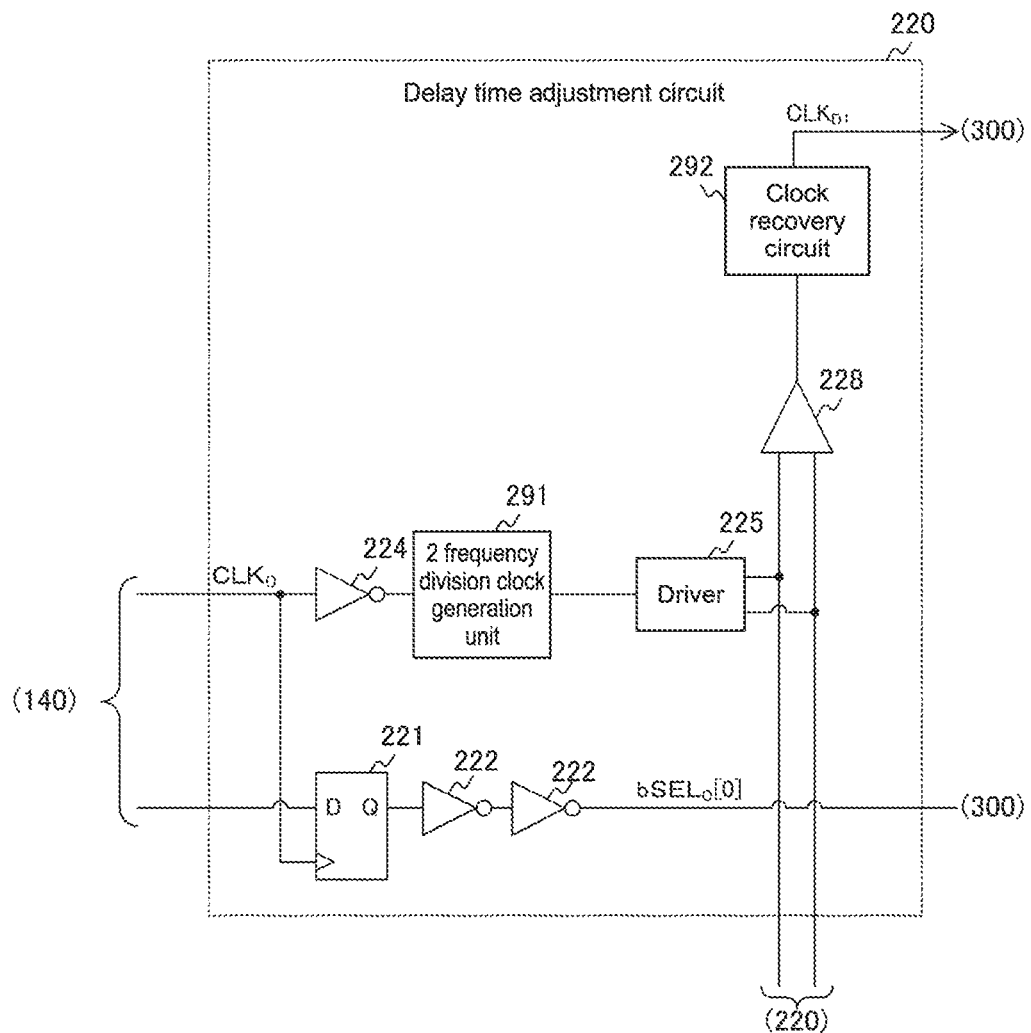
FIG. 27 is a circuit diagram showing one configuration example of a delay time adjustment circuit in a third alternative embodiment of a second embodiment.

FIG. 27 is a circuit diagram showing one configuration example of the delay time adjustment circuit 220 in the third second alternative embodiment of the second embodiment. The delay time adjustment circuit 220 in the third alternative embodiment is different from that in the second alternative embodiment in that it includes a 2 frequency division clock generation unit 291 instead of the two-phase 2 frequency division clock generation unit 281. Also, the delay time adjustment circuit 220 in the third alternative embodiment is different from that in the second alternative embodiment in that it includes a driver 225 instead of the drivers 282 and 284. In addition, in the corresponding delay time adjustment circuit 220 corresponding to the $0^{th}$ ADC row, an amplifier 228 and a clock recovery circuit 292 are further disposed instead of the amplifiers 283 and 285 and the clock recovery circuit 286. An input terminal of the amplifiers 282 is commonly connected to an output terminal of the driver 252 corresponding to the 0 to n−1 ADC rows.

The 2 frequency division clock generation unit 291 frequency-divides the clock signal $CLK_k$ at a division ratio of 2, and supplies the driver 225 with the clock signal. The clock recovery circuit 292 multiplies the frequency from the clock signal $CLK_k$ from the amplifier 228 at a multiplication ratio, and supplies the ADC array unit 300 with the frequency.

In this manner, according to third alternative embodiment of the second embodiment in the present disclosure, the 2 frequency division clock generation unit 291 frequency-divides in parallel the frequency of the clock signal, thereby further reducing the number of the transmission circuit as compared with the case that the two clock signals are multiphased.

The above-described embodiments show examples to realize the present disclosure, and the matters in the embodiments and the matters specifying the claimed invention have a correspondence relationship. Similarly, the matters specifying the claimed invention and the matters in the embodiments to which the same names are applied have a correspondence relationship. However, the present disclosure is not limited to the embodiment and is realized by providing various modifications without departing from the purport of the present disclosure.

Furthermore, operating processing as described in the above-described embodiment may be considered as a method including a series of the processing, or may be considered as a program for executing a series of the processing by a computer or a recording medium for storing the program. As the recording medium, for example, a CD (Compact Disc), an MD (MiniDisc), a DVD (Digital Versatile Disc), a memory card, a Blu-ray™ Disc or the like can be used.

Note that the advantages described in the present disclosure are not necessarily limited, and any of the advantages may be provided in any other embodiments, even if not so shown explicitly shown or so.

The present disclosure may have the following configurations.

(1) An electronic circuit, including:
a timing signal generation unit for generating a timing signal;
a data signal supply unit for synchronizing with the timing signal generated to supply a data signal;
a data signal transmission circuit for transmitting the data signal supplied;
a timing signal transmission circuit for transmitting the timing signal generated by a circuit having a substantially same delay time as the data signal transmission circuit; and
a data holding unit for synchronizing with the timing signal transmitted to hold and output the data signal transmitted.

(2) The electronic circuit according to (1) above, in which the data signal transmission circuit includes
a data signal attenuation driver for attenuating and outputting an amplitude of the data signal supplied, and
a data signal amplifying unit for amplifying the amplitude of the data signal outputted from the data signal attenuation driver to supply to the data holding unit; and
the timing signal transmission circuit includes
a timing signal attenuation driver for attenuating and outputting the amplitude of the timing signal, and
a timing signal amplifying unit for amplifying the amplitude of the timing signal outputted from the timing signal attenuation driver to supply to the data holding unit.

(3) The electronic circuit according to (1) or (2) above, in which
the data signal transmission circuit and the timing signal transmission circuit are arranged adjacent along a predetermined direction.

(4) The electronic circuit according to any one of (1) to (3) above, further including:
a multiphase unit for multiphasing the timing signal generated into a plurality of timing signals having different phases each other to supply to the timing signal transmission unit; and
a restore unit for restoring a signal having the same duty ratio as the timing signal generated from a plurality of the timing signals transmitted, and in which
the timing signal transmission circuit transmits in parallel each of a plurality of the timing signals by the circuit having a substantially same delay time as the data signal transmission circuit.

(5) The electronic circuit according to (4) above, in which
the multiphase unit frequency-divides the frequency of the timing signal generated and multiphases a plurality of the timing signals, and
the restore unit restores the signal having the same frequency and duty ratio as the timing signal generated.

(6) The electronic circuit according to (4) or (5) above, in which
a plurality of the timing signals include two frequency signals having different phases each other.

(7) The electronic circuit according to any one of (4) to (6) above, in which
a plurality of the timing signals includes first, second, third and fourth frequency signals having different phases each other.

(8) The electronic circuit according to (7) above, in which
the restore unit includes
an internal signal output unit for outputting a signal having a predetermined value as a first internal signal from the rise of the first frequency signal to a rise of the second frequency signal, and outputting a signal having a predetermined value as a second internal signal from the rise of the third frequency signal to a rise of the fourth frequency signal, and
a logic add gate for outputting a logical add signal of the first. and second internal signals as the signal restored.

(9) The electronic circuit according to (7) above, in which
the internal signal output unit includes
a first latch circuit for setting a first hold value to a high level when only the first frequency signal of the first and second frequency signals is at a high level, resetting the first hold value to a low level when only the second frequency signal of the first and second frequency signals is at a high level, and outputting the first hold value as the first internal signal, a second latch circuit for setting a second hold value to a high level when only the third frequency signal of the third and fourth frequency signals is at a high level, resetting the second hold value to a low level when only the fourth frequency signal of the third and fourth frequency signals is at a high level, and outputting the second hold value as the second internal signal.

(10) The electronic circuit according to (8) above, in which the internal signal output unit includes, a first flip flop for synchronizing with the rise of the first frequency signal when the second signal is at a low level, and outputting a high level signal as the first internal signal, a second flip flop for synchronizing with the rise of the fourth frequency signal when the third signal is at a low level, and outputting a high level signal as the second internal signal.

(11) The electronic circuit according to any one of (1) to (10) above, further including:

a control signal output unit for synchronizing a control signal that instructs a supply of the data signal with the clock signal generated and outputting the control signal, and a control signal delay unit for delaying the control signal outputted over a predetermined delay time and supplying the control signal to the data signal supply unit, in which the data holding unit includes a data holding circuit for synchronizing with the timing signal transmitted and holding and outputting the data signal transmitted, and a timing signal delay unit for delaying the timing signal transmitted over a delay time substantially matched with the predetermined delay time and supplying the timing signal to the data holding circuit, and the data signal supply unit supplies the data signal based on the control signal.

(12) The electronic circuit according to any one of (1) to (11) above, in which the data signal supply unit includes a plurality of data signal production circuits each of which. generates the data signal, a plurality of the data signal production circuits are arranged in a two-dimensional lattice, and the data signal transmission circuit is arranged for each of the data signal production circuit arranged in a predetermined direction, and transmits the data signal along the predetermined direction.

(13) A solid state image capturing apparatus, including:

a timing signal generation unit for generating a timing signal;

a data signal supply unit for synchronizing with the timing signal generated to supply a data signal;

a data signal transmission. circuit for transmitting the data signal supplied;

a timing signal transmission circuit for transmitting the timing signal generated by a circuit having a substantially same delay time as the data signal transmission circuit; and a data holding unit for synchronizing with the timing signal transmitted to hold and output the data signal transmitted.

(14) The solid state image capturing apparatus according to (13) above, further including:

a first semiconductor on which a pixel for generating a pixel signal is arranged, in which the data signal supply unit generates the data signal from the pixel signal, synchronizes with the timing signal, and supplies the data signal transmission circuit with the data signal, the timing signal generation unit, the data signal supply unit, the data signal transmission circuit and the timing signal transmission circuit are disposed in a second semiconductor connected to the first semiconductor.

(15) A method of controlling an electronic circuit, including:

generating a timing signal;

supplying a data signal by synchronizing with the timing signal generated;

transmitting a data signal for transmitting the data signal supplied;

transmitting the timing signal for transmitting the timing signal generated by a circuit having a substantially same delay time as the data signal transmission circuit; and outputting data by synchronizing with the timing signal transmitted to hold and output the data signal transmitted.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic circuit, comprising:
a timing signal generation circuit for generating a timing signal;
a data signal supply circuit for synchronizing with the timing signal to supply a data signal;
a data signal transmission circuit for transmitting the data signal supplied by the data signal supply circuit;
a timing signal transmission circuit for receiving the timing signal and transmitting the timing signal after passage through a circuit having a substantially same delay time as the data signal transmission circuit; and
a memory configured to synchronize with the timing signal to hold and output the data signal transmitted by the data signal transmission circuit.

2. The electronic circuit according to claim 1, wherein the data signal transmission circuit includes
a data signal attenuation driver for attenuating and outputting an amplitude of the data signal, and
a data signal amplifier for amplifying the amplitude of the data signal outputted from the data signal attenuation driver for supply to the memory; and
the timing signal transmission circuit includes
a timing signal attenuation driver for attenuating and outputting the amplitude of the timing signal, and
a timing signal amplifier for amplifying the amplitude of the timing signal outputted from the timing signal attenuation driver to supply to the memory.

3. The electronic circuit according to claim 1, wherein the data signal transmission circuit and the timing signal transmission circuit are arranged adjacent along a predetermined direction.

4. The electronic circuit according to claim 1, further comprising:
a multiphase circuit for multiphasing the timing signal generated into a plurality of timing signals having different phases each other to supply to the timing signal transmission circuit; and
a restore circuit for restoring a signal having the same duty ratio as the timing signal from a plurality of the timing signals, and in which the timing signal transmission circuit transmits in parallel each of a plurality of the timing signals by the circuit having a substantially same delay time as the data signal transmission circuit.

5. The electronic circuit according to claim 4, wherein the multiphase circuit frequency-divides the frequency of the timing signal generated and multiphases a plurality of the timing signals, and
the restore circuit restores the signal having the same frequency and duty ratio as the timing signal.

6. The electronic circuit according to claim 4, wherein a plurality of the timing signals include two frequency signals having different phases each other.

7. The electronic circuit according to claim 4, wherein a plurality of the timing signals includes first, second, third and fourth frequency signals having different phases each other.

8. The electronic circuit according to claim 7, wherein the restore circuit includes
an internal signal output for outputting a signal having a predetermined value as a first internal signal from the rise of the first frequency signal to a rise of the second frequency signal, and outputting a signal having a predetermined value as a second internal signal from the rise of the third frequency signal to a rise of the fourth frequency signal, and
a logic add gate for outputting a logical add signal of the first and second internal signals as the signal restored.

9. The electronic circuit according to claim 8, wherein the internal signal output includes
a first latch circuit for setting a first hold value to a high level when only the first frequency signal of the first and second frequency signals is at a high level, resetting the first hold value to a low level when only the second frequency signal of the first and second frequency signals is at a high level, and outputting the first hold value as the first internal signal,
a second latch circuit for setting a second hold value to a high level when only the third frequency signal of the third and fourth frequency signals is at a high level, resetting the second hold value to a low level when only the fourth frequency signal of the third and fourth frequency signals is at a high level, and outputting the second hold value as the second internal signal.

10. The electronic circuit according to claim 8, wherein the internal signal output includes,
a first flip flop for synchronizing with the rise of the first frequency signal when the second signal is at a low level, and outputting a high level signal as the first internal signal,
a second flip flop for synchronizing with the rise of the fourth frequency signal when the third signal is at a low level, and outputting a high level signal as the second internal signal.

11. The electronic circuit according to claim 1, further comprising:
a control signal output for synchronizing a control signal that instructs a supply of the data signal with the clock signal generated and outputting the control signal, and
a control signal delay circuit for delaying the control signal outputted over a predetermined delay time and supplying the control signal to the data signal supply circuit, in which
the memory includes a data holding circuit for synchronizing with the timing signal transmitted and holding and outputting the data signal transmitted, and
a timing signal delay circuit for delaying the timing signal transmitted over a delay time substantially matched with the predetermined delay time and supplying the timing signal to the data holding circuit, and
the data signal supply circuit supplies the data signal based on the control signal.

12. The electronic circuit according to claim 1, wherein the data signal supply circuit includes a plurality of data signal production circuits each of which generates the data signal,
a plurality of the data signal production circuits are arranged in a two-dimensional lattice, and
the data signal transmission circuit is arranged for each of the data signal production circuit arranged in a predetermined direction, and transmits the data signal along the predetermined direction.

13. A solid state image capturing apparatus, comprising:
a timing signal generation circuit for generating a timing signal;
a data signal supply circuit for synchronizing with the timing signal to supply a data signal;
a data signal transmission circuit for transmitting the data signal supplied by the data signal supply circuit;
a timing signal transmission circuit for receiving the timing signal and transmitting the timing signal after passage through a circuit having a substantially same delay time as the data signal transmission circuit; and
a memory configured to synchronize with the timing signal to hold and output the data signal transmitted by the data signal transmission circuit.

14. The solid state image capturing apparatus according claim 13, further comprising:
a first semiconductor on which a pixel for generating a pixel signal is arranged, in which
the data signal supply circuit generates the data signal from the pixel signal, synchronizes with the timing signal, and supplies the data signal transmission circuit with the data signal,
the timing signal generation circuit, the data signal supply circuit, the data signal transmission circuit and the timing signal transmission circuit are disposed in a second semiconductor connected to the first semiconductor.

15. A method of controlling an electronic circuit, comprising:
generating a timing signal;
supplying a data signal that is synchronized with the timing signal;
transmitting, by a data signal transmission circuit, the data signal;
receiving the timing signal and transmitting the timing signal after passage through a circuit having a substantially same delay time as the data signal transmission circuit; and
outputting data by synchronizing with the timing signal to hold and output the data signal.

16. The solid state image capturing apparatus according claim 13, wherein
the data signal transmission circuit includes
a data signal attenuation driver for attenuating and outputting an amplitude of the data signal, and a data signal amplifier for amplifying the amplitude of the data signal outputted from the data signal attenuation driver for supply to the memory; and the timing signal transmission circuit includes a timing signal attenuation driver for attenuating and outputting the amplitude of the timing signal, and a timing signal amplifier for amplifying the amplitude of the timing signal outputted from the timing signal attenuation driver to supply to the memory.

17. The solid state image capturing apparatus according claim 13, wherein the data signal transmission circuit and the timing signal transmission circuit are arranged adjacent along a predetermined direction.

18. The solid state image capturing apparatus according claim 13, further comprising:

a multiphase circuit for multiphasing the timing signal generated into a plurality of timing signals having different phases each other to supply to the timing signal transmission circuit; and a restore circuit for restoring a signal having the same duty ratio as the timing signal generated from a plurality of the timing signals, and in which the timing signal transmission circuit transmits in parallel each of a plurality of the timing signals by the circuit having a substantially same delay time as the data signal transmission circuit.

* * * * *